(12) United States Patent
Swamypillai et al.

(10) Patent No.: US 11,321,531 B2
(45) Date of Patent: May 3, 2022

(54) SYSTEMS AND METHODS OF UPDATING COMPUTER MODELED PROCESSES BASED ON REAL TIME EXTERNAL DATA

(71) Applicant: SOFTWARE AG, Darmstadt (DE)

(72) Inventors: Ganesh Swamypillai, Chennai (IN); Shriram Venkatnarayanan, Chennai (IN)

(73) Assignee: SOFTWARE AG, Darmstadt (DE)

(*) Notice: Subject to any disclaimer, the term of this patent is extended or adjusted under 35 U.S.C. 154(b) by 270 days.

(21) Appl. No.: 16/699,162

(22) Filed: Nov. 29, 2019

(65) Prior Publication Data

US 2021/0165966 A1    Jun. 3, 2021

(51) Int. Cl.

| | |
|---|---|
| *G06F 40/30* | (2020.01) |
| *G06N 5/02* | (2006.01) |
| *G06N 5/04* | (2006.01) |
| *G06F 40/295* | (2020.01) |
| *G06F 30/27* | (2020.01) |
| *G06F 40/253* | (2020.01) |
| *G06F 40/205* | (2020.01) |
| *G06N 20/00* | (2019.01) |

(52) U.S. Cl.
CPC .............. *G06F 40/30* (2020.01); *G06F 30/27* (2020.01); *G06F 40/205* (2020.01); *G06F 40/253* (2020.01); *G06F 40/295* (2020.01); *G06N 5/02* (2013.01); *G06N 5/04* (2013.01); *G06N 20/00* (2019.01)

(58) Field of Classification Search
CPC . G06N 5/02; G06N 5/04; G06N 20/00; G06F 30/27; G06F 40/00–58; G06F 16/3344

USPC ............................ 704/1, 9, 10, 257, 270–275
See application file for complete search history.

(56) References Cited

U.S. PATENT DOCUMENTS

| | | | |
|---|---|---|---|
| 9,176,951 B2* | 11/2015 | Patrudu | G06F 40/40 |
| 10,592,544 B1* | 3/2020 | Dasgupta | G06N 3/08 |
| 10,956,790 B1* | 3/2021 | Victoroff | G06K 9/00483 |
| 2012/0084235 A1* | 4/2012 | Suzuki | G06N 20/00 706/12 |
| 2016/0140236 A1* | 5/2016 | Estes | G06N 5/022 707/709 |
| 2017/0109657 A1* | 4/2017 | Marcu | G06Q 10/067 |
| 2018/0032861 A1* | 2/2018 | Oliner | G06F 40/274 |

OTHER PUBLICATIONS

Friedrich Fabian et al. "Process Model Generation from Natural Language Text", ACIS 2010 Proceedings, pp. 1-16, Conference Paper, Jun. 2011.
Kluza Krzysztof et al. "Overview of Recommendation Techniques in Business Process Modeling", AGH University of Science and Technology, pp. 1-12, Conference Paper, Jan. 2013.
Ramos et al. "Process Improvement Based on External Knowledge Context" ACIS 2010 Proceedings, 21st Australasian Conference on Information Systems, pp. 1-11, Dec. 1-3, 2010, Brisbane.

* cited by examiner

*Primary Examiner* — Jesse S Pullias
(74) *Attorney, Agent, or Firm* — Nixon & Vanderhye P.C.

(57) ABSTRACT

A system for automatically updating a process model is provided. The system uses semantic similarities between externally sourced textual data and textual descriptions contained in the process model to classify words in the externally sourced textual data into one of multiple possible actionable categories. The textual data is then parsed for dependent words that are used to automatically update to an existing process model.

17 Claims, 16 Drawing Sheets

SYSTEMS AND METHODS OF UPDATING COMPUTER MODELED PROCESSES BASED ON REAL TIME EXTERNAL DATA

TECHNICAL OVERVIEW

The technology described herein relates to computer modeled processes. More particularly, the technology described herein relates to updating or providing input to such computer model processes based on real time and/or externally sourced data.

INTRODUCTION

Real-world processes include different types of process across many different domains. For example, the assembly of cars on a robotic assembly line. This process may include, for example, steps for arranging pieces of the car (e.g., the door, engine, etc. . . . ), then arranging those pieces in their required locations, and then securing them together. Each step may then have different elements, certain steps may include branching conditions (e.g., what to do if a piece is defective), and other more specific requirements. Other examples include how a sequence of traffic lights is arranged to change within a city, a process for taking a new order from a customer, a process for publishing an article on-line, a process for loading passengers onto an airplane, corporate governance processes, processes for onboarding of new employees at a company, and many other types of real-world processes.

An important aspect of improving such real-world processes is constructing an analytic representation of such processes. Such analytical representations typically involve using a computer modeling language or other software to construct a computer modelled representation of the process. The digitized representation of the real-world process then allows users to better understand (e.g., through a flowcharts or other illustrations, computer programs, hypertext, scripts, or the like) how a given process operates. Such computer modeled representations also provide for increased visibility in making improvements to the real-world process. Example techniques for digitizing real-world processes include Business Process Modeling Notation (BPMN), Universal Process Notation (UPN), flowcharting, Gannt Charts, Petri-Nets, and others. By using such digitized representations of a real-world process, a clearer understanding can be provided to users for how the process actually operates. The digital representation can also provide consistency for the controls of the process and allow for identification (either manually or automatically using the computer) of redundancies and inefficiencies in the process. In certain instances, improvements to a process may first be modeled into the computer modelled representation of the process before being implemented as the real-world process. For example, a user may determine that the car manufacturing process may be improved by adding an additional process step. The updated computer model of the process with that additional step may then be viewed and tested before being implemented on the assembly line.

In today's society, processes can be subject to many external factors some of which can change relatively rapidly. Such factors can include changes in weather (e.g., rising sea levels), changes in resourcing (previously used raw materials are becoming more scarce, or new materials have been developed), advances in technology (e.g., advancements in renewable energy sources, etc.), changes in government regulations that need to be followed by a business (e.g., GDPR), changes in a local or global economic situation (e.g., deflation vs inflation), the competitive landscape (e.g., entry of a company into a new market sector), and the like. In certain instances, persons who are in charge of real-world processes may not even be aware of the relationship between certain external factors and the performance of a real-world process.

Accordingly, it will be appreciated that new and improved techniques, systems, and processes are continually sought after. For example, techniques that provide for updating or providing recommendations (e.g., formalistically) to existing computer modelled representations of the real-world processes by using external, and possibly real-time, data sources.

SUMMARY

In certain example embodiments, a computer system determines changes to already modelled process by using natural language processing based on externally sourced data. The computer system then improves upon the computer model process by using natural language processing and the determined changes.

In certain example embodiments, a computer system for updating an existing computer process model based on externally sourced data is provided. The computer system includes or interfaces with a non-transitory storage medium configured to store a process model that includes a plurality of process model entities that each include textual descriptions. The computer system also includes or interfaces with a transceiver configured to receive a plurality of electronic data messages from at least one external data source, each of the plurality of electronic data messages including text data. The computer system includes a processing system that is configured (e.g., programmed) to operate as follows. The computer system generates at least one semantic similarity value that is between 1) the first text data of at least a first message of the plurality of electronic data messages, and 2) the textual description of a first process model entity of the plurality of process model entities. The computer system classifies the first text data, based on at least a first word that is within the first text data, into one of multiple possible classifications. The computer system parses the first text data to determine one or more linked words that are grammatically linked to the first word. The computer system retrieves, from the process model, a process model entity that includes textual description that is associated with the one or more linked words. The computer system then automatically update the process model based on the retrieved process model entity.

This Summary is provided to introduce a selection of concepts that are further described below in the Detailed Description. This Summary is intended neither to identify key features or essential features of the claimed subject matter, nor to be used to limit the scope of the claimed subject matter; rather, this Summary is intended to provide an overview of the subject matter described in this document. Accordingly, it will be appreciated that the above-described features are merely examples, and that other features, aspects, and advantages of the subject matter described herein will become apparent from the following Detailed Description, Figures, and Claims.

BRIEF DESCRIPTION OF THE DRAWINGS

These and other features and advantages will be better and more completely understood by referring to the following detailed description of example non-limiting illustrative embodiments in conjunction with the drawings of which.

DETAILED DESCRIPTION

In the following description, for purposes of explanation and non-limitation, specific details are set forth, such as particular nodes, functional elements, techniques, protocols, etc. in order to provide an understanding of the described technology. It will be apparent to one skilled in the art that other embodiments may be practiced apart from the specific details and examples described below. In certain instances, detailed descriptions of well-known methods, systems, devices, techniques, etc. are omitted so as not to obscure the description with unnecessary detail.

Sections are used in this Detailed Description solely in order to orient the reader as to the general subject matter of each section; as will be seen below, the description of many features spans multiple sections, and headings should not be read as affecting the meaning of the description included in any section.

Figure 1:
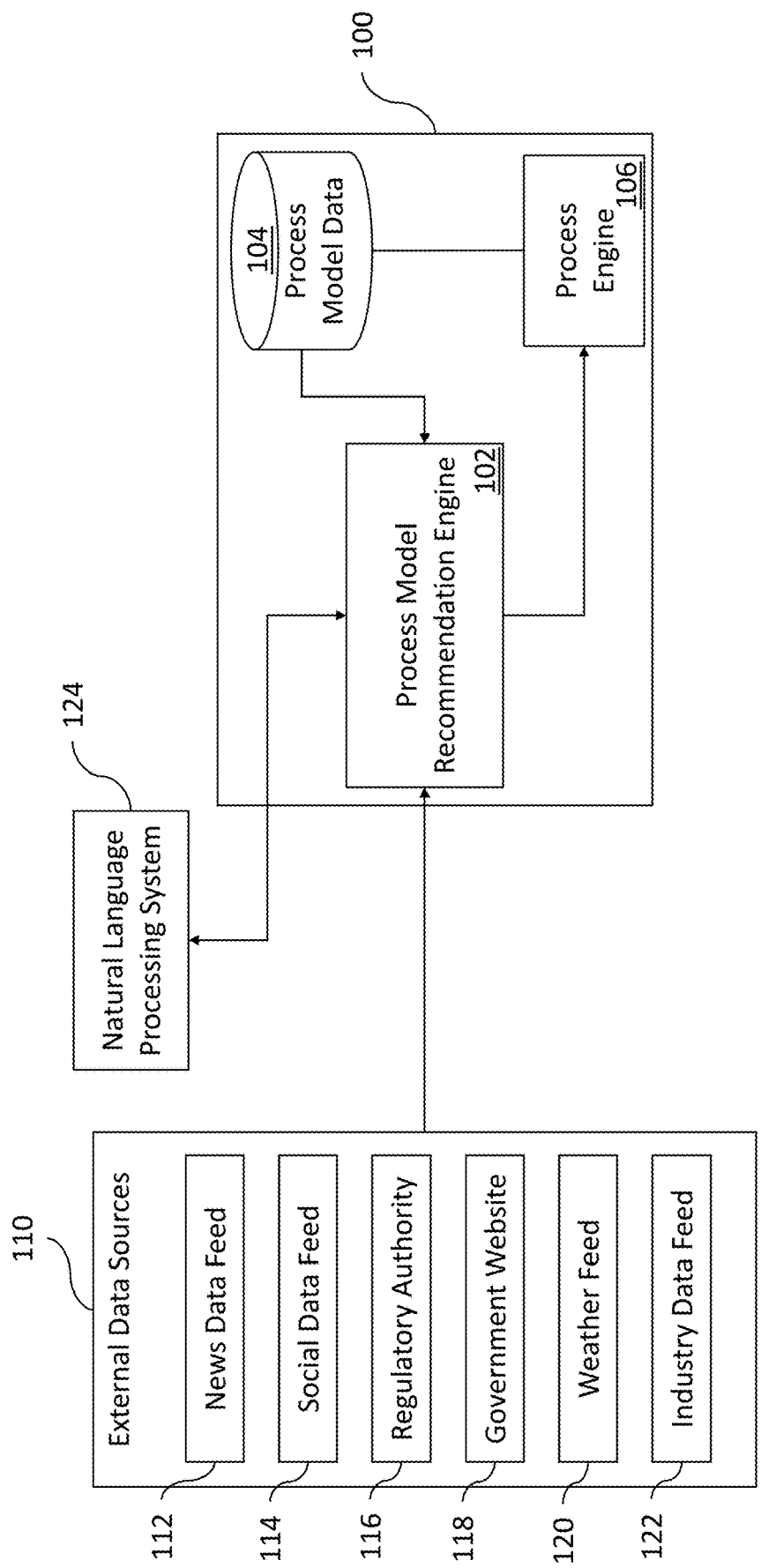
FIG. 1 shows an architecture diagram of an example system according to certain example embodiments.

In many places in this document, including but not limited to the description of FIG. 1, software modules, software components, software engines, and/or actions performed by such elements are described. This is done for ease of description; and it should be understood that, whenever it is described in this document that a software module or the like performs any action, the action is in actuality performed by underlying hardware elements (such as a processor, hardware circuit, and/or a memory device) according to the instructions that comprise the software module or the like. Further details regarding this are provided below in, among other places, the description of FIG. 10.

Overview

In certain example embodiments, a computer system is provided that includes a process model recommendation engine that generates recommendations for modifying or updating existing process models based on external real-world data sources. The process model recommendation engine includes functionality for determining (e.g., using natural language process) similarities between data obtained from external data sources and the process entities that are part of an existing process model. From these determined similarities, improvements to an existing process model may be generated and automatically added to the process model.

The techniques discussed herein thus provide improvements over prior approaches. For example, approaches that may have only operated during design time for modeling the process. In contrast to such approaches the techniques herein allow the system (e.g., the process model recommendation engine) to automatically modify, update, and/or enhance an existing process model to thereby keep it in-line with the external world (e.g., via the external data sources). Such improvements can thus provide tangible benefits to process modelers, process owners, and process users as it helps in maintaining the state of process in line with the outside world—e.g., by making the computer modelled of the process responsive (e.g., aware) to what is happening in the "real" world for that process.

Description of FIG. 1

FIG. 1 shows an architecture diagram of an example computer system 100 according to certain example embodiments.

The system shown in FIG. 1 includes a computer system 100, which is an example of computing device 1000 that is discussed in connection with FIG. 10. Computer system 100 communicates (e.g., via network interface device(s) 1006) with one or more external data sources 110 in order to acquire externally sourced information on real world events. Computer system 100 may also communicate with a natural language processing system 124. For example, the Google Cloud Natural Language API may be used as the natural language processing system 124. Thus, computer system 100 may interface with one or more cloud-based services for natural language processing. In certain example embodiments, the natural language processing (NLP) system 124 may be provided as module within computer system 100. An example of the input provided to NLP system 124 and the output received therefrom is shown below:

TABLE 1

| |  |
|---|---|
| HTTP request - POST method: | |
| https://language.googleapis.com/v1/documents:classifyText | |
| JSON Input | { |
|  | "document": "Input text" |
|  | } |
| JSON Output | JSON Output: |
|  | { |
|  | "categories": [ |
|  | { |
|  | "name": string, |
|  | "confidence": number |
|  | } |
|  | ] |
|  | } |

External data sources 110 can include a news data feed 112, a social data feed 114, a regulatory authority data feed 116, a government website 118, a weather data feed 120, an industry data feed 122, and others. Each of the external data sources may be accessible by the computer system 100 via a website or other electronic communication. For example, one of the external data sources 110 may be an RSS feed and other may be access via HTTP POST and GET commands. In other examples, FTP or other transfer protocols may be used. In certain example embodiments, the external data sources 110 provide a textual description of information or some event. For example, a weather data feed may provide a textual description of an incoming hurricane or other weather event. A government website may post the text of newly enacted (or proposed) legislation. An industry data feed for telecommunications may post the details of a newly agreed upon telecommunication wireless standard. Thus, the external data sources provide, in response to queries from computer system 100 or unprompted, textual (or other) data to the computer system 100 that is then further processed.

Computer system 100 includes a process model recommendation engine 102, a database 104 that stores process model data, and a process engine 106. The data from the external data sources 110 is supplied to the process model recommendation engine 102, which may then act upon that data (as discussed in greater detail below).

Database 104 may be, for example, a relational or other type of database that stores process model data. Specifically, the process model data may include all of the entities of a process model including the nodes, connections and properties of the nodes and connection of the process model. Illustrative examples of portions of a process model are shown in FIGS. 7A-7C, 9A, and 9B.

Process engine 106 is a computer program that is executable by at least one processor of the computer system 100. When executed the process engine 106 provides an application programming interface (API) to access the various entities of the process model that are stored in the database 104. In certain example embodiments, the process engine 106 may be a Business Process Management (BPM) engine.

One of the illustrative examples is discussed in connection with the figures is as follows. The example involves a computer modeled process of a business process in the banking domain. The example is provided to help understand how a news article (e.g., provided from news data feed 112) may be used to help improve an existing process (e.g., a business process). The technical aspects of the features discussed herein may be used to provide for automating a change in a process and/or its computer modeled representation thereof. It will, of course, be appreciated that the use of a news article and a banking process are merely provided by way of a non-limiting example and other external sources of textual data may be used along with other types of modelled processes and their corresponding descriptions.

The example process relates to new customer enrolment for a bank. In this example, there may be identification requirements that are needed in order for a bank to take on a new customer. Depending on the nation or jurisdiction, citizens can be identified by various means. For example, in India, Aadhar card, PAN card, and the like are identifications that may be provided to citizens. Business (banks in this specific example) may then rely upon or use such identifications for easy enrolment and tracking purposes.

However, governments may create additional laws, rules, or other regulations that may affect business and other organizations. The additional laws, rules, or other regulations may be mandatory, optional, etc. They may also be applicable to specific business industries (e.g., just to banking) or more broadly applicable across industries (e.g., any industry that uses a computer). In the case of banking, a government (e.g., the Indian government) may pass a law requiring the Aadhar card for opening a new account with a bank. However, such laws may be changed to, for example, make the Aadhar card not mandatory. The example discussed below is provided within this context where a bank has a modelled process that indicates the Aadhar card is mandatory for opening new accounts, but the law or regulation has recently been changed such that the Aadhar card is no longer mandatory. The techniques discussed herein may be used to recognized this real-world change and automatically determine that there should be a change in the computer modelled process as a result (e.g., to change the process related to customer enrolment for the bank). This change may further occur in real-time with the acquisition of the externally sourced data. In other words, once the external data is provided to the system, then it may act upon (e.g., immediately) that data.

In brief, the computer system 100 (via the process model recommendation engine 102) may be used to categorize news articles (or other data externally sourced). The process model recommendation engine 102 (discussed in greater detail below) is then able to determine the similarity of the news article with the process model data (e.g., the various entities for the existing computer modeled process) concerning the text of the news articles. The process model recommendation engine 102 automatically makes changes to the computer modeled process by interacting with the process engine 106 based on such generated data. In certain examples, the modifications of the automatically modified process may be clearly marked to draw the attention of a process owner. This may allow for a final confirmation to be performed by the process owner.

It will be appreciated that even in case where further adaptations are required (e.g., of the automatically proposed changes), such adaptations may be smaller than otherwise would be required of the process owner (e.g., a user). This is because erroneous typos or false references may have been eliminated via the automated processing that is performed by the process model recommendation engine 102. For example, adaptations that are performed by a user may be those required to keep the modifications (and the process model) in accordance with, for example, the proprietary process regulations of the bank (or banking industry in general).

Description of FIGS. 2-5D

Figure 2:
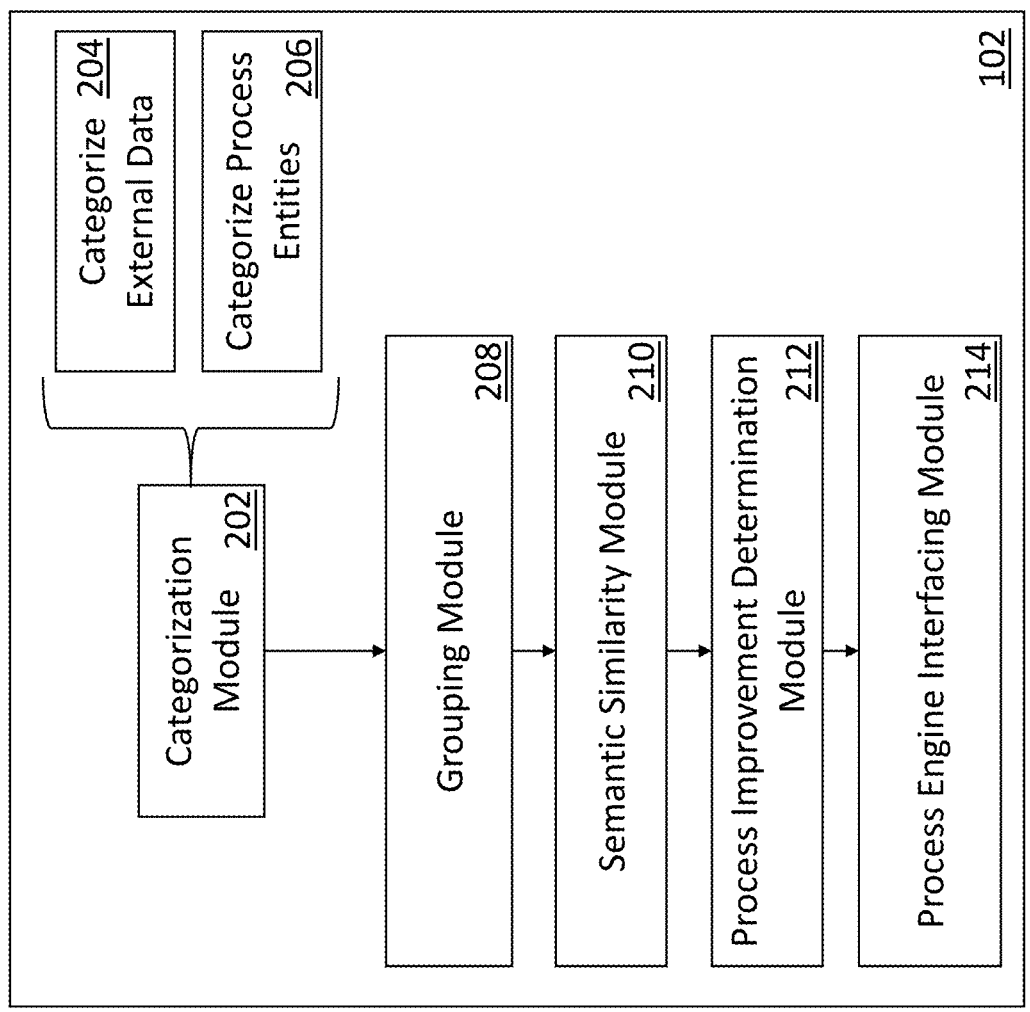
FIG. 2 shows a block diagram of the functional modules contained within the process model recommendation engine of FIG. 1 according to certain example embodiments.

FIG. 2 shows a block diagram of the functional modules contained within the process model recommendation engine 102 of FIG. 1 according to certain example embodiments. The functional modules collectively provide for the functionality discussed in connection with the process shown in FIG. 3. Each of the modules shown in FIG. 2 may be a computer program or parts of a computer program (e.g., each may be a separate function within a computer program). Each of the modules in FIG. 2 also causes the computer system 100 to carry out the programmed functionality associated with the respective modules.

The process model recommendation engine 102 includes categorization module 202, which includes separate sub-modules of categorizing external data 204 and categorizing the process entities 206. Also included in the process model recommendation engine 102 is a grouping module 208, a semantic similarity module 210, a process improvement determination module 212, and a process engine interfacing module 214. Each of the these modules will be discussed in connection with one or more of elements of the process shown in FIG. 3.

Figure 3:
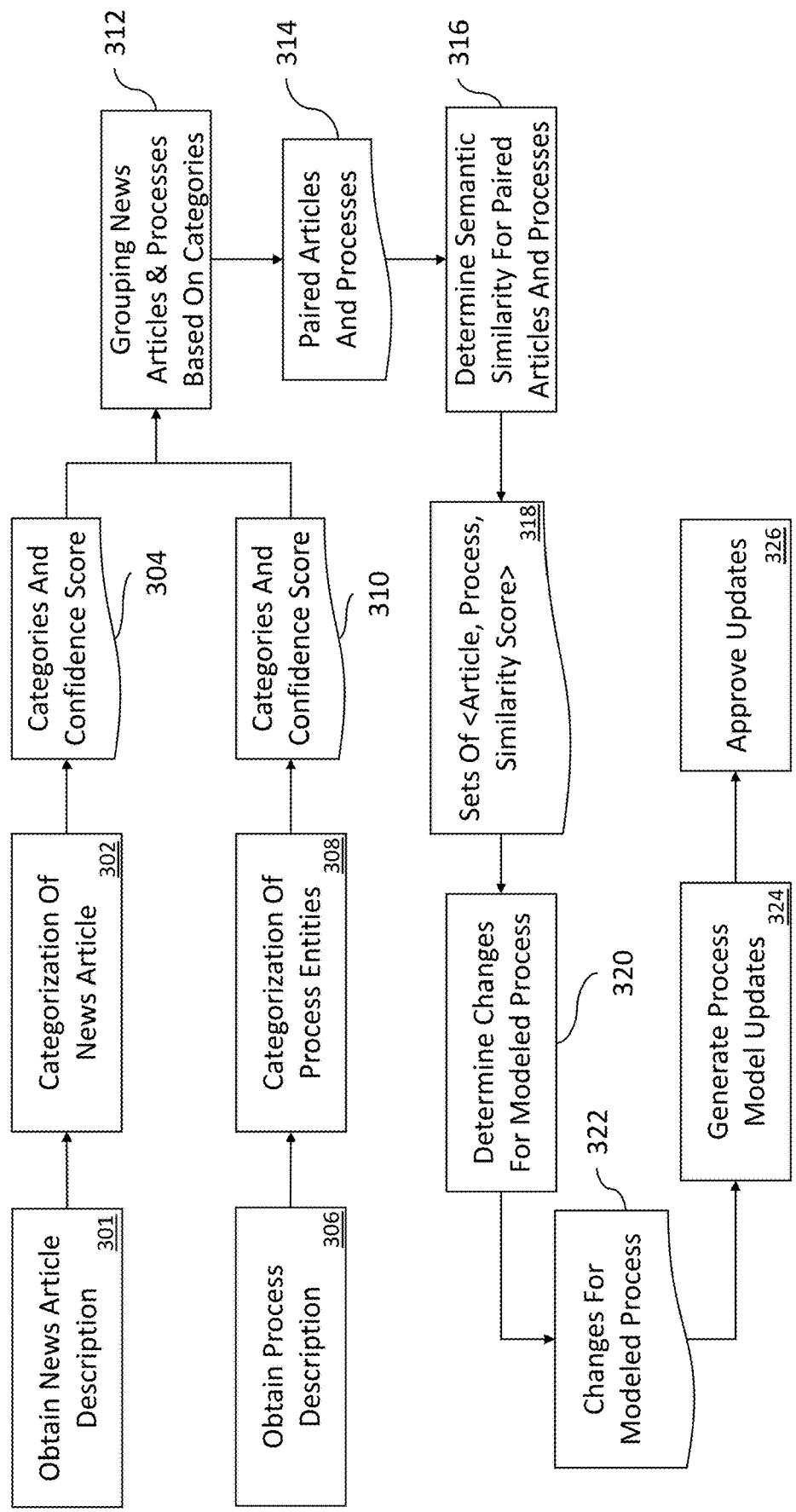
FIG. 3 is a flow chart of a process performed by the process model recommendation engine of FIG. 1.

The categorization module 202 performs the processing associated with the functionality of steps 301, 302, 306, and 308 in FIG. 3. In 301, the externally sourced data is retrieved form the external sources. In certain example embodiments, the external data is cached or otherwise stored locally until being obtained from local storage at step 301.

In step 302, the data from the external data sources is categorized (e.g., in terms of topics). This may include categorizing the data using, for example, natural language processing (e.g., via NLP system 124). In the non-limiting specific example that is discussed herein, the external data source is the news data feed 112 that supplies news articles to the computer system 100 and the process model recommendation engine 102 thereof.

The data feeds used by the computer system 100 for the external data sources 112 may be configurable (e.g., different websites, address etc.). For example, one of multiple different news data feeds 112 may be the website from newsapi.org. Table 2 shows an example of both the input provided to that website and the output retrieved therefrom (the content portion of this example news article has been truncated).

TABLE 2

| | |
|---|---|
| Input | https://newsapi.org/v2/top-headlines?country=in&apiKey=8a5bac57428545f789dbb809c6d4e8ec |
| Output | { <br>     "status": "ok", <br>     "totalResults": 38, <br>     "articles": [ <br>         { <br>             "source": { <br>             "id": null, <br>             "name": "financialexpress.com" <br>             } <br>             "author": "InsightsIAS", <br>             "title": "Aadhar Card not mandatory to open bank accounts, new mobile connections! Aadhar Amendment Bill 2019 gets Cabinet nod", <br>             "description": "Aadhar Card not mandatory to open bank accounts, new mobile connections! Aadhar Amendment Bill 2019 gets Cabinet nod", <br>             "url": "https://www.financialexpress.com/aadhar-card/aadhar-card-not-mandatory-to-open-bank-accounts-new-mobile-connections-aadhar-amendment-bill-2019-gets-cabinet-nod/1605746/", <br>             "urlToImage": "https://images.financialexpress.com/2019/05/AADHAR-CARD-HISTORY.jpg", <br>             "publishedAt": "2019-06-12T05:04:13Z", <br>             "content": "The Cabinet on Wednesday cleared a Bill to allow voluntary use of Aadhar as identity proof for opening bank accounts and procuring mobile phone connections. The Bill - which will be in form of amendment to Aadhar Act 2016 and other laws and will replace an ordinance issued in March, 2019 - also proposes stiff penalties for violation of norms.... [+6140 chars]" <br>         }, <br>         ...] <br> } |

Accordingly, the computer system 100 may transmit (e.g., request) one or more news articles using the "input" above. In response to that request, computer system 100 will then be provided with (e.g., receive) the output. Multiple such news articles may be received in this manner. In certain examples, only certain fields of the above output may be provided back to the computer system 100. For example, the request may only provide the "description" portion of the request—i.e., "Aadhar Card not mandatory to open bank accounts, new mobile connections! Aadhar Amendment Bill 2019 gets Cabinet nod" back to computer system 100.

Once the relevant text is obtained at step 301, then the news articles (e.g., the externally provided data) are categorized at step 302. This may involve determining or assigning one or more categories to the textural description and then assigning a confidence score to that classification. In certain example embodiments each textual description is associated with exactly one category and a corresponding confidence score. In certain examples, each textual description is associated with two or more categories that each have a confidence score. In certain example embodiments, when a textual description is assigned to multiple categories, the category with the highest confidence score may be used as the category for that textual description.

In certain example embodiments, the categorization and calculation of a confidence score may be provided via a natural language process service that is hosted or otherwise provided via the NLP System 124. In certain example embodiments the NLP service may be the Google Cloud Natural Language API. This API has built-in support for various predefined textural categories and can be used to perform classification on provided text for those categories. The following is a code snippet that may be used as part of step 302 (or 308) in certain example embodiments to invoke such a service.

TABLE 3

```
from google.cloud import language
from google.cloud.language import enums
from google.cloud.language import types
gcs_uri = 'gs://cloud-samples-data/language/android.txt'
client = language.LanguageServiceClient( )
document = types.Document(
    gcs_content_uri=gcs_uri,
    type=enums.Document.Type.PLAIN_TEXT)
categories = client.classify_text(document).categories
for category in categories:
    print(u'=' * 20)
    print(u'{:<16}: { }'.format('name', category.name))
    print(u'{:<16}: { }'.format('confidence', category.confidence))
```

Table 4 shows an example of input provided to the NLP service and the responsive output. Both the input and output in this example are in JSON.

TABLE 4

| | |
|---|---|
| Input | { <br>     "document": "Aadhar Card not mandatory to open bank accounts, new mobile connections! Aadhar Amendment Bill 2019 gets Cabinet nod" <br> } |

TABLE 4-continued

```
Output    {
              "categories": [
                  {
                  "name": Finance,
                  "confidence": 0.62
                  }
              ]
          }
```

Accordingly, for the example shown in Table 4, there is a 0.62 confidence value that the provided description text from the originally retrieved news article is related to the "Finance" category. The input for step 302 may be the textual description or textual content (e.g., the description of the news article contents) and the output from step 302 may be the categories with respective confidence scores for each news article.

At 306, the textual description of the entities within the modelled process is extracted from database 104 (e.g., using a database query). The text of these modelled process entities is then categorized at 308 by using, for example, the NLP system 124. As discussed herein, an example of the NLP system 124 may be the cloud-based natural language API provided by Google. In general, the input 308 is the text of the process entity (e.g., the textual description of the process and/or entities thereof). The output 310 from 308 is similar to 302. Specifically, each textual description is now associated with one or more determined categories and at least one corresponding confidence score for that category.

Taking the above discussed banking example, the database 104 includes a modeled process for functions and procedures to operate on accounts for customers in a bank. The textual description of the model entities may be extracted and then supplied as input to the NLP system 124. Example input provided to the NLP system 124 and responsive output is shown in table 3 below.

TABLE 5

```
Input     {
              "document": "This process explains high level functions
              performed by bank such as loan processing, new account
              opening, maximize revenue process"
          }
Output    JSON Output:
          {
              "categories": [
                  {
                  "name": Finance,
                  "confidence": 0.81
                  }
              ]
          }
```

At step 312 the input from 304 and 310 is processed so that elements from 304 are grouped with elements from 310. Specifically, in the context of the news article example, news articles with their respective categories and confidence values (304), and business processes with their respective categories and confidence values (310) are provided as input to 312. The processing in 312 then generates a set of pairs of news articles and processes that have the same, similar, or identical categories. The processing for 312 may be defined in pseudo code as follows:

TABLE 6

```
Let category set for news article be represented by C_NA.
    C_NA = { Ci, Cj, Ck }
Let category set for business process be represented by C_BP.
    C_BP = { Cp, Cq, Cr }
If C_NA ∩ C_BP = { }, Where { } represents empty set.
    Then, we skip the next set of steps.
If C_NA ∩ C_BP ≠ { }, Where { } represents empty set.
    Then, we proceed to next set of steps.
    Let S_NA represent set of news articles.
    Let S_BP represent set of business processes.
    Then, let's define a set of pairs as:
        SP = { { NA_i , BP_j } : NA_i belonging to S_NA, BP_j belonging
to S_BP , where
            C_NA ∩ C_BP ≠ { }
        }
```

More specifically, the news article text could be as follows: NA: {{"Put simply, this means it will allow voluntary use of Aadhar number for authentication and identity proof in opening of bank accounts."} }. While the process description text could be as follows: BP: {{"This process models aspects of using identification proofs to link a customer during opening of bank accounts. Identity proofs accepted as part of KYC process in opening of bank accounts. PAN, passport photos, aadhar are mandatory for KYC process"} }. When these two textural descriptions are processed by the NLP system 124, they both are determined to be associated with the finance category (e.g., identical with respect to Finance category). Thus, these two separate texts would form a pair that is the output 314 from 312. In other words, using the above pseudo code example:

TABLE 7

```
S_NA = { NA1, ... } where S_NA represent set of news articles
S_BP = { BP1, ... } where S_BP represent set of business processes.
C_NA1 = { Finance }
C_BP1 = { Finance}
SP={{ NA1 , BP1 }} where C_NA1 ∩ C_BP1 = {Finance} ≠ { }
```

The output 314 from 312 is used as input for 316 that is performed by the semantic similarity module 210. The semantic similarity module 210 determines semantic similarity scores for grouped processes (and/or entities thereof) and news articles (e.g., text from the external data sources 110). Specifically, the input for 316 that is performed by the semantic similarity module 210 may be set of pairs of news articles (e.g., external data) and processes that have identical categories. The output 318 from the semantic similarity module 210 may include set of triplets with the textural data (e.g., a sentence in the news article), the textual description or other test associated with the process, and a semantic similarity score. In certain example embodiments, the semantic similarity module 210 uses a sentence segmentation service provided by, for example, spaCy (at spacy.io). In certain example embodiments, the semantic similarity module 210 may perform semantic similarity detection using, for example the dandelion API, which is a semantic text analytics API and/or word mover's algorithm. The following is an example pseudo code implementation that may be implemented by the semantic similarity module 210.

First, let the set of pairs of news articles and process with identical categories be represented as:
SP={{NA_i, BP_j}: NA_i belonging to S_NA, BP_j belonging to S_BP, where C_NA∩C_BP≠{ } }

Considering a given pair {NA_i, BP_j}, for the news article NA_i, spaCy's sentence segmentation library may be used to split the news article into sentences. Other techniques may also be used to segment the textual description of the externally sourced data. Accordingly, in this example, $SE_{NAi}=\{SE^1_{NAi}, \ldots, SE^n_{NAi}\}$ where $SE_{NAi}$ represent the set of sentences belonging to news article represented by $NA_i$. The following is an example code snippet for spaCy's sentence segmentation:

TABLE 8

```
import spacy
nlp = spacy.load("en_core_web_sm")
doc = nlp(u"This is a sentence. This is another sentence.")
for sent in doc.sents:
    print(sent.text)
```

Next, $SE_{NAi}$ represents the set (i.e., $\{SE^1_{NAi}, \ldots, SE^n_{NAi}\}$ for the sentences belonging to a given news article of $NA_i$. Similarly, $SE_{BPj}$ represents set (i.e., $\{SE^1_{BPi}, \ldots, SE^n_{BPj}\}$) the function texts that belong to the process that is represented by $BP_j$. An example of $SE_{NA1}$ for the above discussed Aadhaar example, {"The Cabinet on Wednesday . . . ", "The Bill—which will be", "Put simply, this means it will allow voluntary use of Aadhar number for authentication and identity proof in opening of bank accounts" . . . , $SE^n_{NA1}$}. An example of $SE_{BP1}$ may be {"This model is used for describing the fees and charges", "This Process Model is used to open new accounts", "Identity proofs accepted as part of KYC process in opening of bank accounts. PAN, passport photos, aadhar are mandatory for KYC process" . . . , $SE^n_{BP1}$}.

Each of the sentences and function texts are then paired to form the set $SE=\{\{SE^1_{NAi}, SE^1_{Bpj}\}, \ldots, \{SE^n_{NAi}, SE^n_{Bpj}\}\}$. For each pair present in the set SE, a semantic similarity score (discussed below) will be determined and appended to each element (the pair) in the set. Accordingly, a set of triplets will be created as $T_{SE}=\{\{SE^1_{NAi}, SE^1_{Bpj}, m_1\}, \ldots, \{SE^n_{NAi}, SE^n_{Bpj}, m_n\}\}$, with m representing the similarly scores calculated for the sets $SE^1_{NAi}, SE^1_{Bpj}$ to $SE^n_{NAi}, SE^n_{Bpj}$. An example of set $T_{SE}$ may be {{"The Cabinet on Wednesday . . . ", "This model is used for describing the fees and charges", 0.02}, {"The Cabinet on Wednesday . . . ", "This Process Model is used to open new accounts", 0.24}, {"Put simply, this means it will allow voluntary use of Aadhar number for authentication and identity proof in opening of bank accounts.", "Identity proofs accepted as part of KYC process in opening of bank accounts. PAN, passport photos, aadhar are mandatory for KYC process", 0.75}, . . . }.

The set $T_{SE}$ may then be filtered to only include those pairs that have similarity scores greater than a threshold value. For example, only those m values that are 0.5 or greater (e.g., the third triplet from the above set that has a similar score of 0.75) will be included in the filtered set.

Semantic similarity scores may be calculated using different techniques. An example technique may be using the dandelion API/Word mover's algorithm. The following is an example dandelion request and response using the above example.

TABLE 9

```
Endpoint: https://api.dandelion.eu/datatxt/sim/v1
Sample request:
https://api.dandelion.eu/datatxt/sim/v1/?text1=
Put%20simply%20this%20means%20it%20will%20allow%20voluntary%20use%
20of%20Aadhar%20number%20for%20authentication%20and%20identity%20p
roof%20in%20opening%20of%20bank%20accounts&text2=
Identity%20proofs%20accepted%20as%20part%20of%20KYC%20process%20i
n%20opening%20of%20bank%20accounts%20PAN%20passport%20photos%2
0aadhar%20are%20mandatory%20for%20KYC%20process
Sample response:
{
    "timestamp": "2019-09-01T16:29:37",
    "text1": " Put simply, this means it will allow voluntary use of Aadhar number for
authentication and identity proof in opening of bank accounts",
    "text2": " Identity proofs accepted as part of KYC process in opening of bank
accounts. PAN, passport photos, aadhar are mandatory for KYC process ",
    "semantic similarity": 0.75
}
```

Accordingly, the semantic similarity module 210 may produce a set for triplets 318 that includes the text from the external data source, text from the modeled process, and a similarity score between the two.

Figure 4:
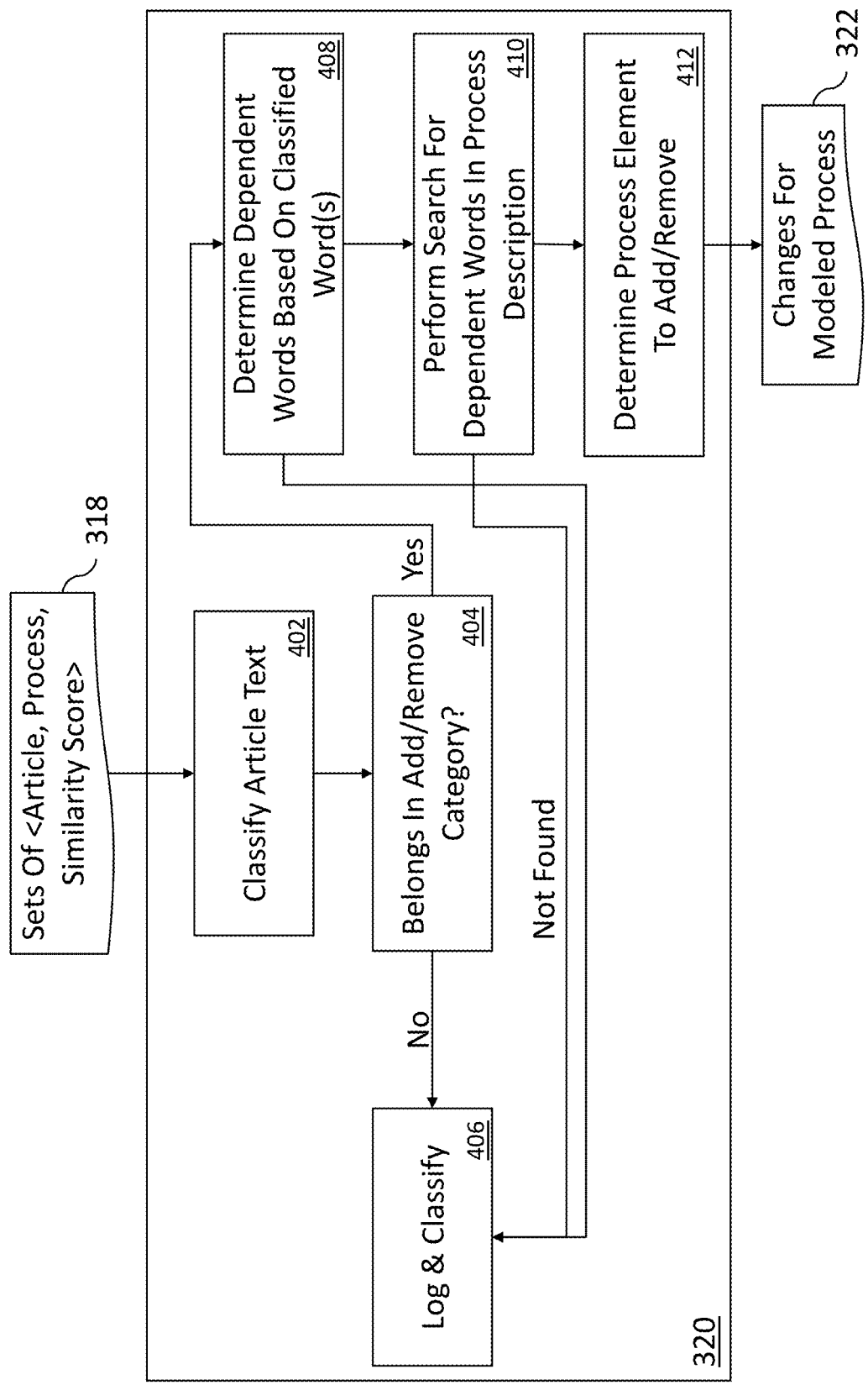
FIG. 4 is a flow chart of processing that is performed as part of the process shown in FIG. 3.

Next the Process Improvement Determination Module 212 is programmed to carry out determining changes for the modeled process at 320. This may include determining whether changes are warranted and what those changes should include (e.g., whether addition or removal of existing steps from the modeled process or both, whether changes to existing steps should be made, etc.). For addition/removal of steps, the system may highlight/determine the news article text along with addition and removal category comprising of words/phrases that may be added to/removed from molded processes. The output from 320 may include the identifier of one or more entities of the modeled process (e.g., accessed from database 104) and a list of one or more additions or removals to that process. The list may include keywords/phrases that have been identified from the text of the external source data and then used to identify one or more process entities of the modeled process. The sub-processes that are performed as part of 320 are shown in FIG. 4.

Generally, there are two possible changes that can be made to a modeled processes: addition and removal. More specifically, text may be added or removed to/from the function texts of the modeled process. This may include, for example, adding a new entity to the modeled process or removing an existing entity.

These possible changes may be treated as a text classification problem where the sentence text of the news article is classified into either an addition category or a removal category. In certain example embodiments, machine learning can be used for the classification in order to provide for automatically mapping the sentence text of the external data source (e.g., the news article) to the addition or removal category. In certain example embodiments, further categories may be used. For example, a "change" category may be used to classify certain textual elements.

To illustrate, consider the phrase "Put simply, this means it will allow voluntary use of Aadhar number for authentication and identity proof in opening of bank accounts" from an example news article. As can be seen, 'voluntary' may denote that the Aadhar card is not a mandatory requirement for the customers anymore. In such a case, this would represent a removal category (e.g., to remove the requirement for the Aadhar card).

As another example, "Reserve bank of India mandated voterId for account opening in all centralized banks." In this case, "mandated" may denote that voterId needs to be presented by the customer to the bank when an new account is opened. This may represent or be classified into the addition category.

Such classification may be performed by a machine learning algorithm in order automatically classify newly provided text (e.g., text that is different from the text used to train the machine learned model). Thus, the machine learned model may be used to learn similarities (e.g., similar words) automatically and would not just be limited to rule based learning. Below is example machine learning code which trains a machine learning model to classify text based on addition and removal categories.

When the model is first being trained, it may be seeded with an initial set of words that are used to classify for the categories "addition" and "removal." Naturally, these lists are only examples and other may be generated based on particular application or domain need.

TABLE 10

```
{
    "addition-category": ["required", "mandatory", "essential", "need"],
    "removal-category": ["must not", "should not", "needless",
"removed", "voluntary"]
}
```

The following is a pseudo-code snippet corresponding to the classification of article text step 402 in FIG. 4.

TABLE 11

```
# create training data
training = [ ]
output = [ ]
# create empty array for output
output_empty = [0] * len(categories)
for doc in docs:
    # initialize (bow) for each document in the list
    bow = [ ]
    # list of tokenized words for the pattern
    token_words = doc[0]
    # stem word
```

TABLE 11-continued

```
    token_words = [stemmer.stem(word.lower( )) for word in
token_words]
    # create bag of words array
    for w in words:
        bow.append(1) if w in token_words else bow.append(0)
    output_row = list(output_empty)
    output_row[categories.index(doc[1])] = 1
    # training set contains a the bag of words model and the output row
which
    # tells category that bow belongs to.
    training.append([bow, output_row])
```

It will be appreciated that the above classification algorithm is not just a rule-based algorithm, and does more than rule-based specifics. Instead, the algorithm may automatically learn similar phrases or words and identify the classification whether it belongs to addition or removal category. For example, the initial training set may contain a small or minimal set of phrases/words which will teach the machine learning model about the words belonging to a particular category. Since the machine learning model learns from these examples, in the testing phases or in production, it could be provided with a totally new set of words/phrases. The model will be able to determine the category on its own (e.g., automatically and without additional human input).

Referring again to the example output from 316,

TABLE 12

```
{
    "timestamp": "2019-09-01T16:29:37",
    "text1": " Put simply, this means it will allow voluntary use of Aadhar number for
authentication and identity proof in opening of bank accounts",
    "text2": " Identity proofs accepted as part of KYC process in opening of bank
accounts. PAN, passport photos, Aadhar are mandatory for KYC process ",
    "semantic similarity": 0.75
}
```

The classify article text step 402 may determine, in this specific non-limiting illustrative embodiment, that the article text (e.g., from the "text1" field above in table 12) is associated with the "removal" category. And the word or phrase that is associated with this classification is the "voluntary" word within the text.

In any event, once the article text has been run against the trained model at 402, then, at 404, the process may determine whether the text belongs to the additional or removal category. If the textual description was not classified into either category, then at 406, that text is logged for future follow-up and/or potential human classification, and subsequent model retraining. For the text of a particular news article that was not classified at 402 then it may be recommended or sent to an administrator for further processing. For example, the text may be sent a process administrator that may then input trigger words if the news article will be used to as a basis for adapting the modeled process. Such trigger words or other annotations to the article may then be used to further train the machine learn model (e.g., as part of a feedback loop). In certain example embodiments, a message will automatically be created and sent to the process administrator. The message may include the currently identified dependent phrases/words. A user (e.g. the process administrator) can then include one or more words from the text as examples for the action categories and subject those words to retraining for the model.

If, however, the textual description is classified into one or more of the predetermined categories at 402, then at 408, the textual description of the article is parsed to find dependent words that are around the words/phrases associated with the classified category (e.g., addition/removal words). These dependent words will then be searched in function text of modeled processes at 410.

Figure 5A:
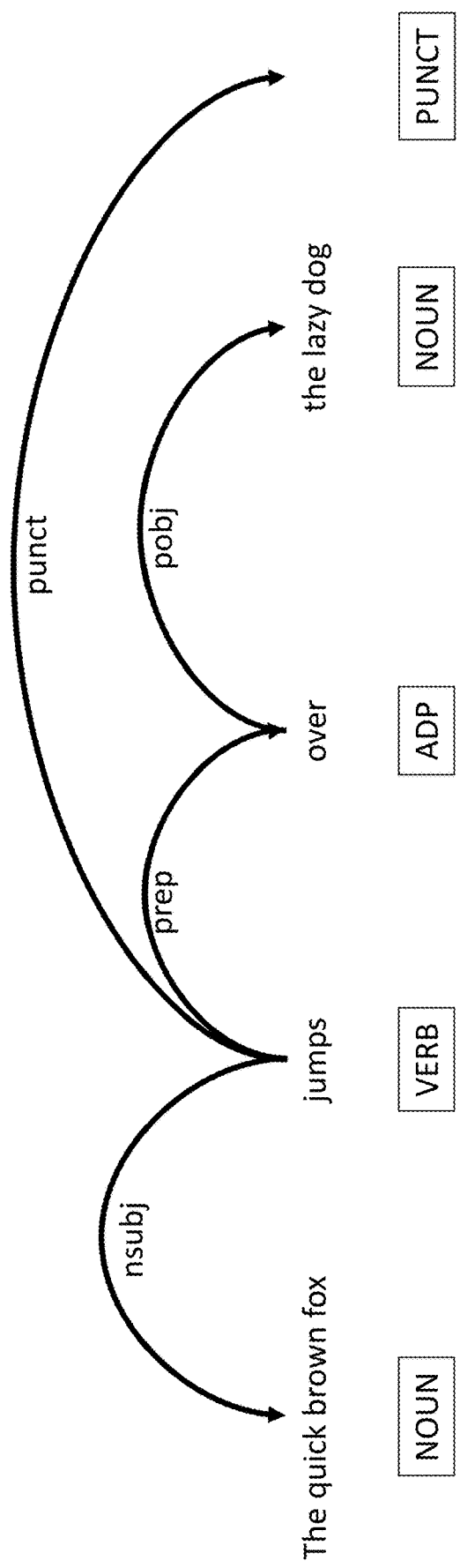
FIGS. 5A-5D show examples of grammatically parsing example sentences according to certain example embodiments.
Figure 5B:
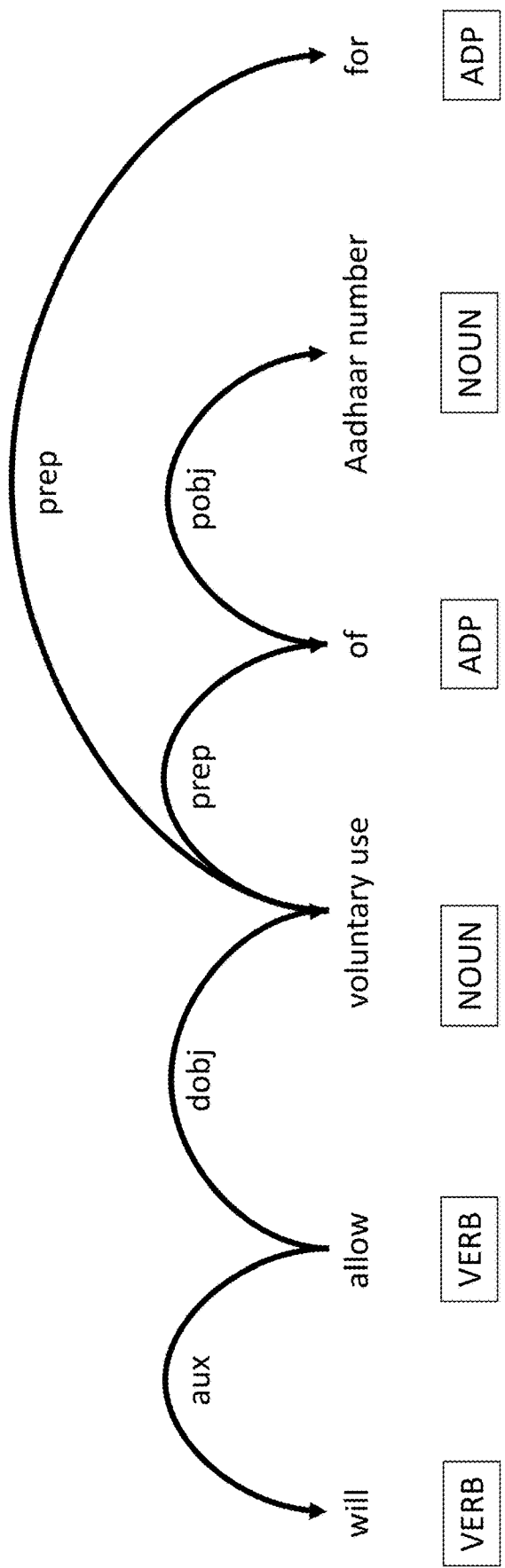

The dependency parsing performed at 408 may be a type of parsing for a given sentence where in the dependencies between the words and their types are identified. In certain example embodiments, spaCy may be used. Illustrative examples of this dependency parsing are shown in FIGS. 5A and 5B (using the spaCy). In FIG. 5A, the sentence "The quick brown fox jumps over the lazy dog" is parsed. The example shown in FIG. 5B is a portion of the above text from the Aadhaar news article that is discussed herein.

As shown in FIG. 5A, the various aspects of the sentence are identified. For example, NOUN, VERB, ADPOSITION are identified and the words associated with the types are also identified. Further, the VERB "jumps" is also determined to be linked to the NOUN "The quick brown fox". These form the dependency parsing, where different words are dependent on other parts of the sentence. SpaCy may identify the following aspects: 1) ADJ: adjective, 2) ADP: adposition, 3) ADV: adverb, 4) AUX: auxiliary verb, 5) CONJ: coordinating conjunction, 6) DET: determiner, 7) INTJ: interjection, 8) NOUN: noun, 9) NUM: numeral, 10) PART: particle, 11) PRON: pronoun, 12) PROPN: proper noun, 13) PUNCT: punctuation, 14) SCONJ: subordinating conjunction, 15) SYM: symbol, 16) VERB: verb. The following is a code snipped used to implement spaCy's dependency parsing.

TABLE 13

```
import spacy
nlp = spacy.load("en_core_web_sm")
doc = nlp(u"Put simply, this means it will allow voluntary use of Aadhar number
for authentication and identity proof in opening of bank accounts.","  Identity
proofs accepted as part of KYC process in opening of bank accounts. PAN,
passport photos, aadhar are mandatory for KYC process")
for token in doc:
    print(token.text, token.dep_, token.head.text, token.head.pos_,
        [child for child in token.children])
```

FIG. 5B shows how a portion of the text around the "voluntary" word (identified in 402) may be analyzed. The parsing of the sentence that includes "voluntary" shows that the "voluntary" phrase is linked to both "of" and "for." These are both adpositions and, according to the processing that is performed for determining dependent words, may be ignored. The terms "of" and "for" are also checked to see if they are linked to any other useful dependent words or phrases within the sentence. In this case, the term "Aadhaar number" is also linked to "voluntary" through the use of the preposition "of." Thus, for this example, step 408 will determine "Aadhaar number" as a dependent word or phrase that is associated with the originally keyed voluntary word. This may include working with the phrase "Aadhaar number" and/or searching with the components of that phrase— "adhaar" and, separately "number." In certain example embodiments, any of nouns, pronouns, verbs, and adverbs will be identified as useful dependent words or phrases per step 408. Meanwhile, adpositions, adjectives, conjunctions may be ignored. However, adpositions, adjectives, conjunctions may also be used to determine if there are any dependent phrases or words from those that are also linked to the original word or phrase. Accordingly, 408 may determine those words or phrases that are directly or indirectly (e.g., via, for example, an adposition) linked to the word in the sentence that was classified at 402. In certain examples, this may result in a set of dependent words that are associated with the predetermined categories (e.g., add or remove).

In the Aadhaar example, any or all of the word "Aadhaar," the word "number," and the phrase "Aadhaar number" may be added to a dependent word dataset that will be used to search database 104 for relevant entities within a computer modeled process. It will be appreciated that when the term "word" is discussed herein that, unless otherwise specified (e.g., by using "a single word" or the like) it is intended to include a word phrase (e.g., two or more words).

If, at 408, no dependent phrases are located within the sentence that included the classified word from step 402, then that sentence, the body of text in which the sentence is included, the classified word from the sentence may all be written to a database or other log file for future review at step 406. For example, perhaps the relevant subject associated with the classified word is in another sentence of the textual content.

At 410, the set of dependent words is used to search the database 104 and the process entities stored therein to determine text that is associated with one or more process entities of the computer modeled process. This may be performed by using API or database queries via, for example, the process engine 106.

If no identified dependent word(s) are found within the database 104, then a record of the identified dependent words and other associated data may be stored to log file for future follow up. In certain examples, a message or the like may be sent to a process administrator with the following format: 1) the function/entities to be added to process (e.g., the category, such as add or remove, and the word that was categorized), and/or 2) the dependent phrases/words which are not found in process function texts.

If there is a match identified within the text of the computer modeled process entities, then each match may be added, at step 412, to set (322) that reflects possible changes to be made to the computer modeled process. Each pair may include the text from the external data source (e.g., the news article) and the text from the process entity (e.g., the text from the description field of the process entity). Below is one example pair that may be added to the set of positively identified external source and process pairings.

TABLE 14

{
{"Put simply, this means it will allow voluntary use of Aadhar number for authentication and identity proof in opening of bank accounts." ;
"Identity proofs accepted as part of KYC process in opening of bank accounts. PAN, passport photos, aadhar are mandatory for KYC process"
}
}

Here, the first element in the pair is the text from the news article example and the next element is the text of the process description that was identified. Additional data that may linked to each pair may include whether the corresponding pair is associated with addition or removal, the word that was classified from the text of the external data source, the dependent word used to identify the text within the modeled process, the grammatical significance of both the classified word and the dependent word (e.g., whether it is a noun, verb, etc.), the database GUID associated with process model and/or entities thereof, etc. Naturally, if no changes are identified, then the process may end.

Figure 6:
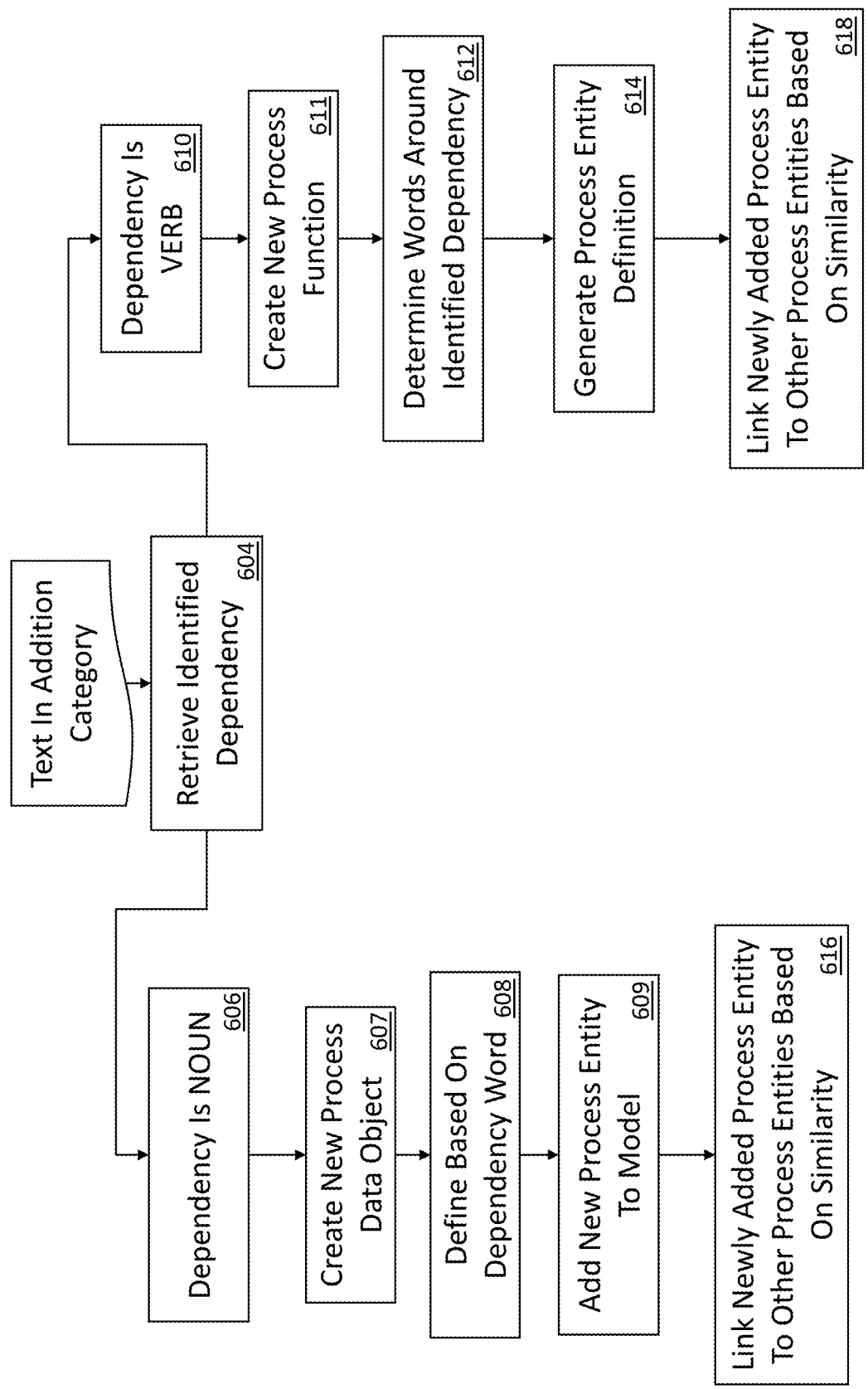
FIG. 6 is a flow chart of an example process that is performed for when a word is classified into the addition category.
Figure 8:
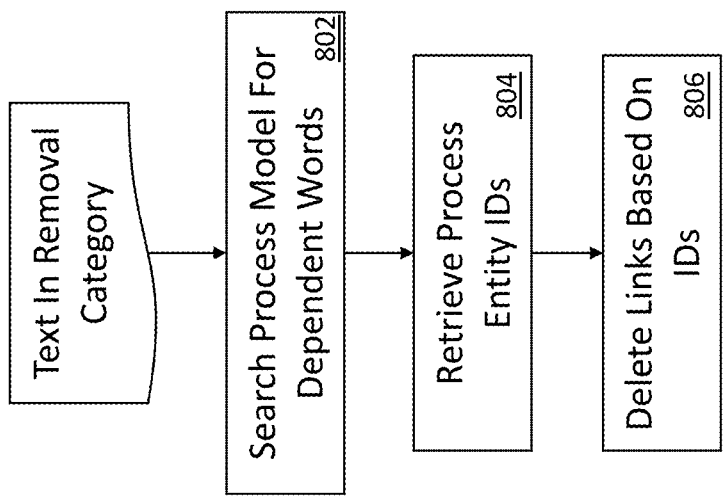
FIG. 8 is a flow chart of an example process that is performed for a word that is classified into the removal category.

Once the changes for the modeled process 322 are determined from 320, then the process proceeds to step 324 that is performed by the Process Engine Interfacing Module 214 to update the process model in accordance with the determined change(s). Each type of identified change (e.g., addition, removal, etc.) may have a corresponding process that is used for generating process model. The processing performed within 324 is further described in connection with FIGS. 6 and 8 below. FIG. 6 shows a process for handling addition changes to the process model. FIG. 8 shows a process for handling removal changes to the process model.

At 326, once the process model has been automatically updated, then one or more users may be notified (e.g., via email or the like) of the changes. The users (e.g., a process owner) may approve, reject, or modify and then approve the automatically proposed changes to the process model.

Figure 7A:
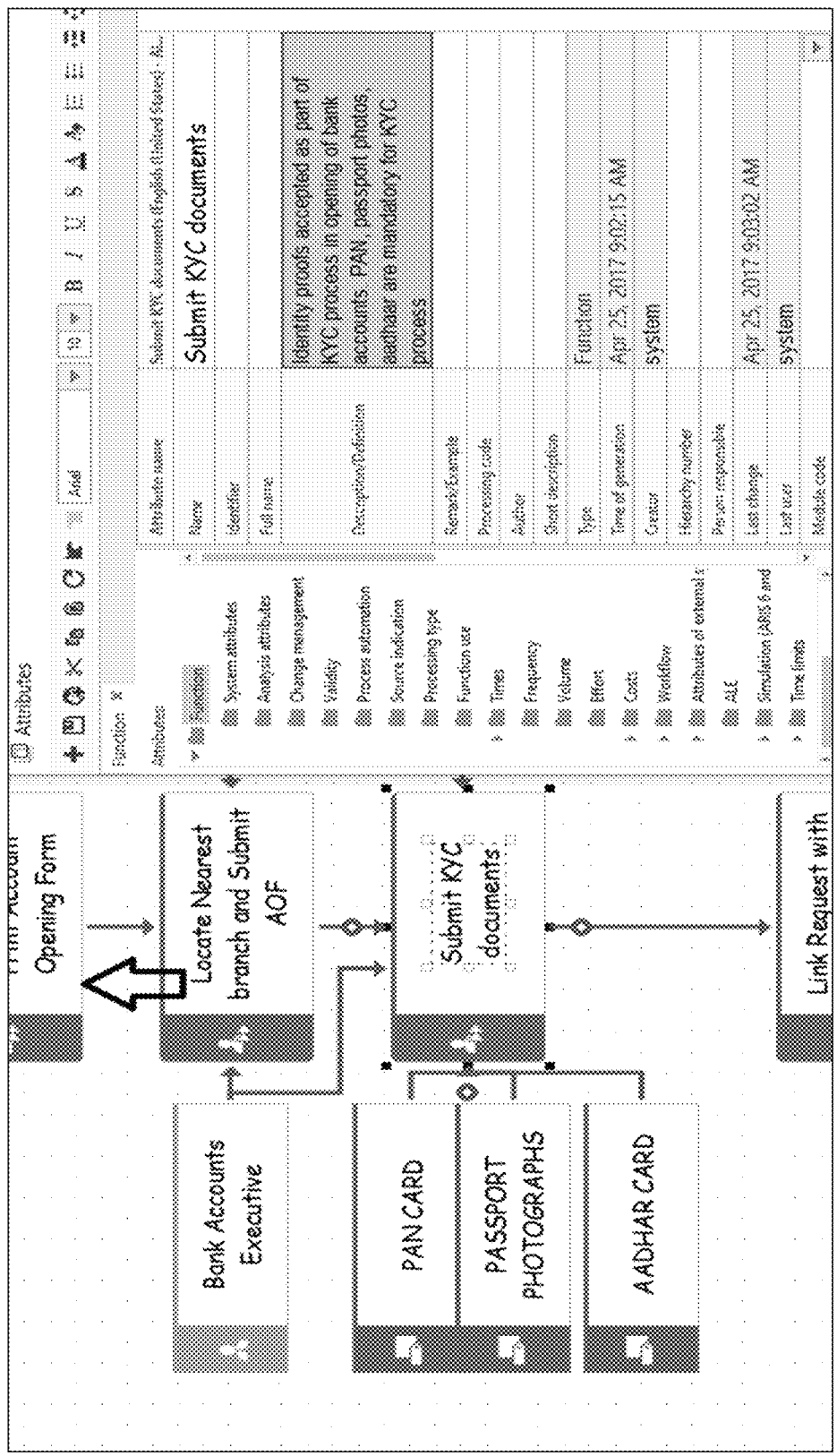
FIGS. 7A-7C are screenshots of a graphical user interface that shows an example process model that is being modified according to the process shown in FIG. 6.
Figure 7B:
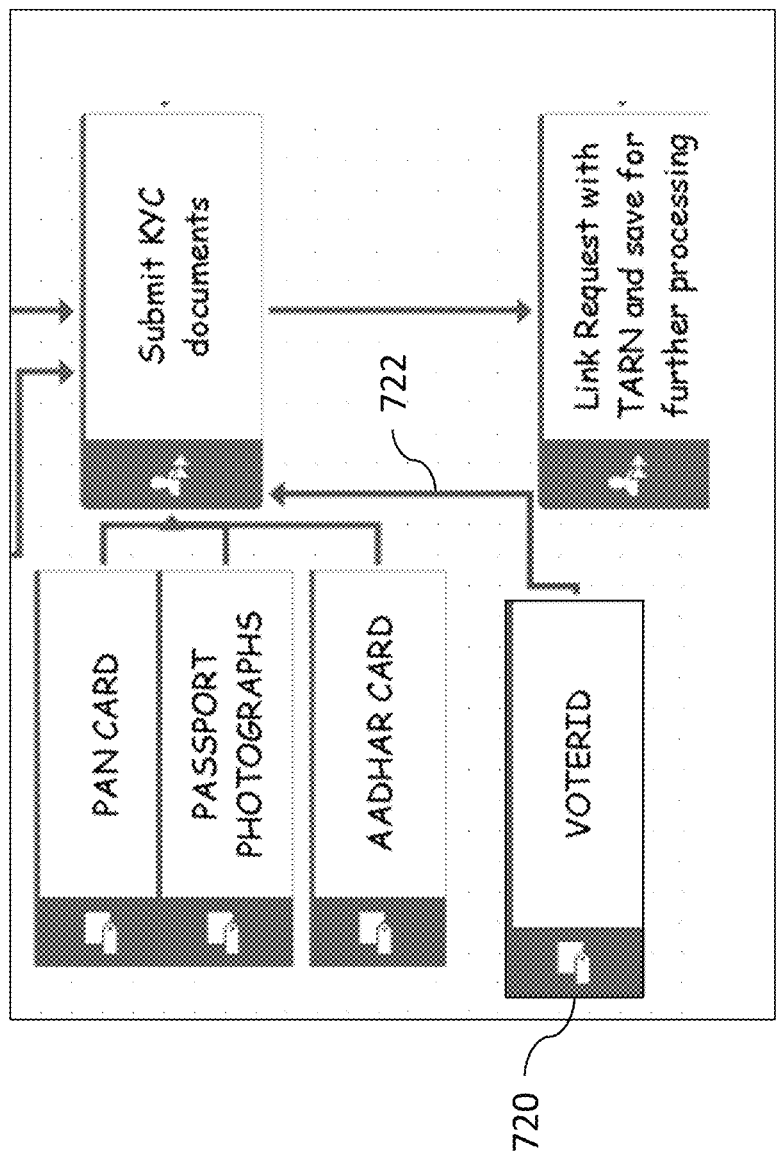
Figure 7C:
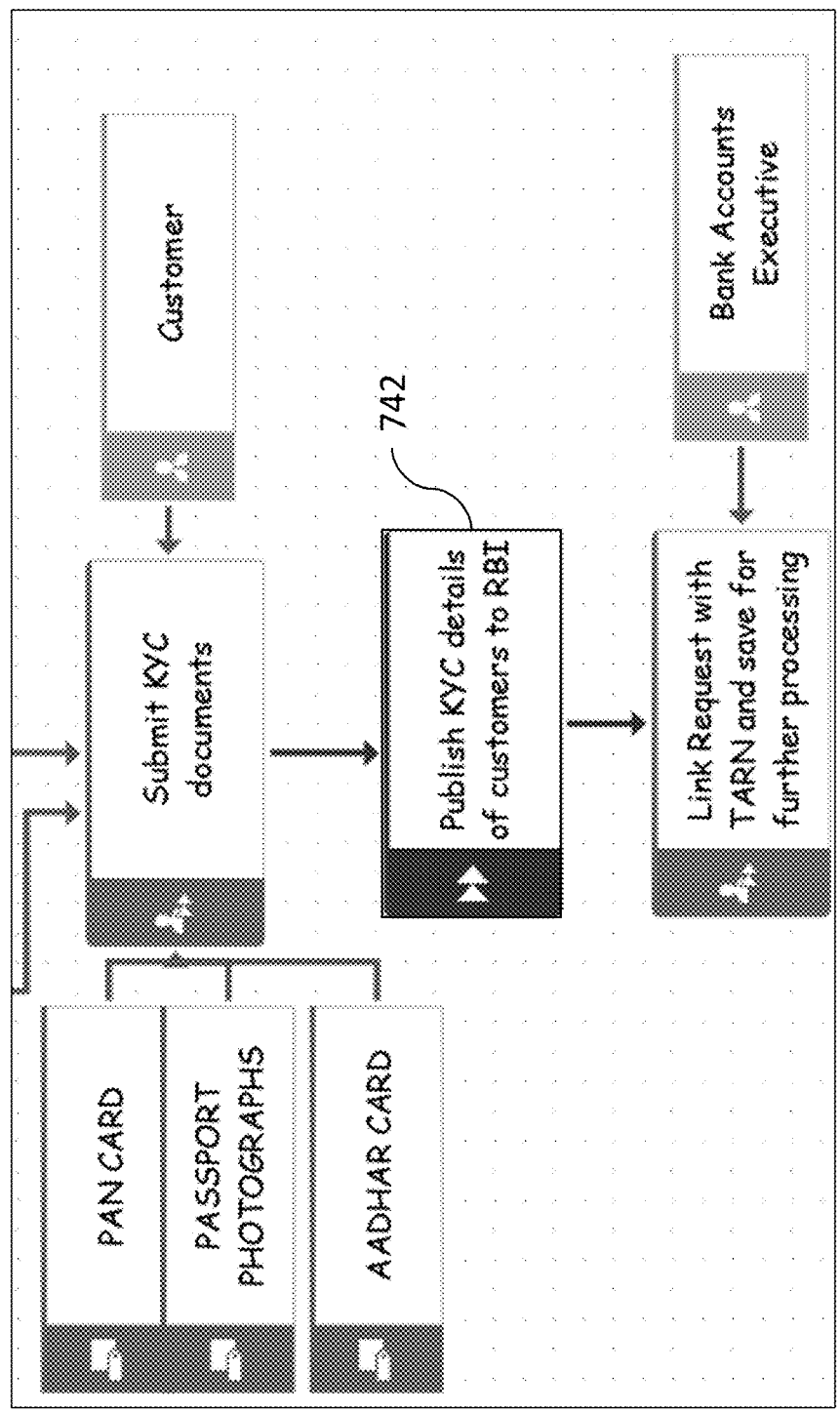

Description of FIG. 6-7C

The process shown in FIG. 6 may be performed by the process engine interfacing module 214 and relates to the process that is performed when the text from the external data source has been classified into the "Addition" category (e.g., via 402). When this occurs the process engine interfacing module 214 is used to interface (via the process engine 106) with the process model data that is stored in database 104.

In certain example embodiments, there are two types of additions to an existing process model. One is where the dependent words are associated with nouns or pronouns (606) and the other is when the dependent words are associated with verbs or adverbs (610). When the dependent words are associated with verbs or adverbs, a new process function, process step, process activity, process event, or the like is created and then added into the existing computer modeled process. In general, verbs/adverbs are associated with "actions" and thus elements (e.g., such as the "function" element from an event-driven Process Chain (EPC) model) that correspond to actions may be created for the process model.

If, however, the dependent words are nouns or pronouns, then a new data object, artifact, property, attribute, etc. may be created. In general, nouns/pronouns are associated with a person, place, or thing and thus elements that capture such concepts within the specific process model (e.g., depending on the notation of the existing process model) may be created to represent such a person, place, or thing actions. For example, a "information, material, or resource object" element from an event-driven Process Chain (EPC) model.

At 604, the word that is identified as being dependent (e.g., "Aadhaar" from the example shown in FIG. 5B) on the classified word (e.g., "voluntary" from example FIG. 5B) is retrieved. If that word is a NOUN then the process moves to 606. If the dependent word is a VERB, then the process moves to 610.

If the dependent word is a noun (or a pronoun), then a new process data object is created at 607. For example, the data object may be input to an process function of the process model.

The newly created process entity (e.g., the data object) may then be defined at 608. In certain example embodiments, the definition of the newly created process entity (e.g., the data object) can be drawn from the externally sourced text (e.g., the news article) based on the parsing as discussed herein. In certain examples, no other processing may be needed (e.g., in terms of further definitions for the process entity). Thus, for example, the newly created data object may be defined based on, or as, the text of the identified dependent word (e.g., "Aadhaar number"). An example code snippet associated with this aspect is as follows:

TABLE 15 import spacy
nlp = spacy.load("en_core_web_sm")
doc = nlp(u" Reserve bank of India mandated voterId for account opening in all centralized banks")
for token in doc:
    print(token.text, token.lemma_, token.pos_, token.tag_,
        token.dep_, token.shape_, token.is_alpha, token.is_stop)

The newly created (and defined/described) process entity may then be added, at 609, to the computer process model via the API of the process engine 106.

Once the new process entity is added to the process model, a link is added (again via the API of the process engine 106) between the new process entity and the process entity that was initially identified based on similarity to the text of the external article (e.g., part of the set 318 with the similarity score).

In certain example embodiments, any changes (e.g. connecting arrows, labels, new process elements, data object, entities, etc.) that are made to the existing process model/diagram will be highlighted (e.g., in red or the like). In certain example embodiments, this may function similar to, for example, track changes in a text document or other document. In certain examples, such highlighting or other visual indication is mandatory for these types of changes as it allows a process owner to validate the correctness of the changes (e.g., in the event that the exact definition of the entity/function cannot be accurately determined) before they are adopted (finalized) into the process model.

Figure 5C:
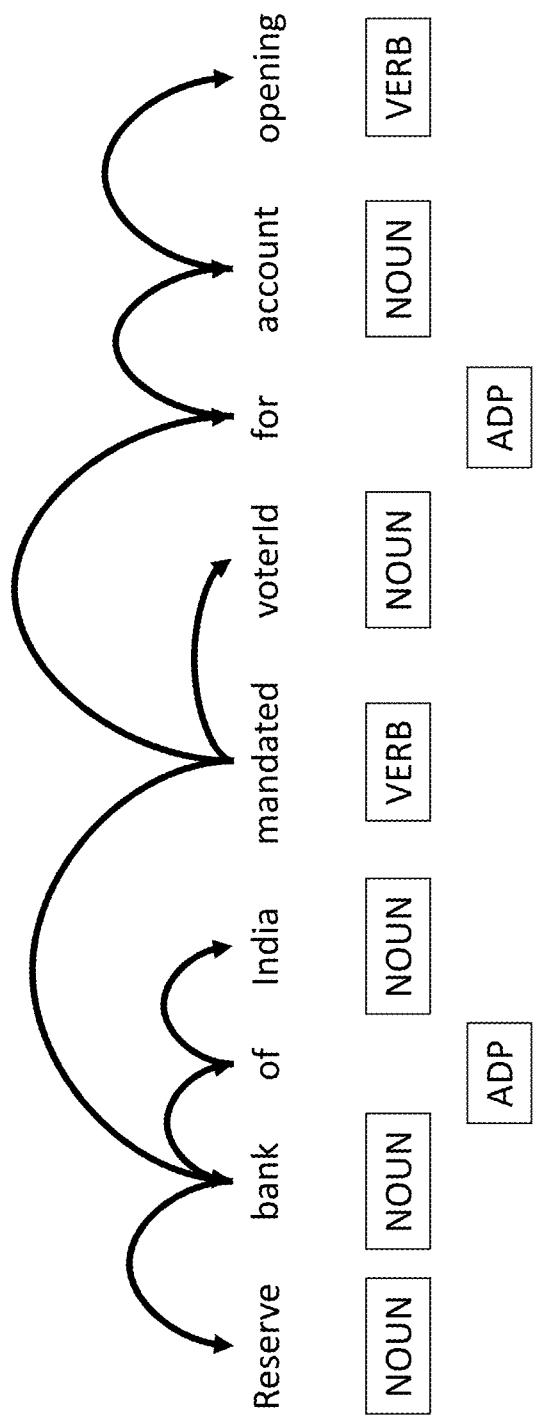

To illustrate the above discussion of the processing that occurs for nouns (and pronouns), FIG. 7A shows (via a GUI) a portion of an existing process model that includes a step for "Submit KYC documents." FIG. 5C shows a portion of text from an external source (e.g. a news article) that has been parsed to identify dependencies between the words of one of the sentences within the article. In this example, the Submit KYC documents process entity and the news article in question are automatically identified as having a sufficiently high similarity score (e.g., at 316). The word "mandated" from the text of the article is then classified into the addition category (step 402) and voterId is then identified as a dependent word (step 404) from the categorized word. VoterId is a noun and thus the process shown in FIG. 6 proceeds to "NOUNS" 606 an is performed. A new process data object is created at 607 and defined based on the identified dependency word—"voterId." In other words, the dependent word "voterId" is added to the newly created process entity and that entity is then added to the process model at 609. Further, a process link is added, at 616, between this newly created process entity and the previously identified process entity (e.g., "Submit KYC documents") that was identified as being sufficiently similar to the original text of the new article. This is shown in FIG. 7B where process entity "VOTERID" 720 is automatically added to the process model and link 722 is automatically added from newly added process entity 720 to the previously identified "Submit KYC documents" process entity. As noted above, any or all of the changes to the process model that are automatically added via this process are highlighted or otherwise visually marked as such within the process model. This allows the process model owner to review and confirm the automatically provided changes. An example of the code snippet associated with the above example is as follows:

TABLE 16

```
// get instance of BPMEngine
BPMEngine bpmEngine = BPMEngine.getInstance( );
// create entity
Entity newEntity = new Entity('voterId');
// get the process which is being dealt with
BPMProcess bpmProcess = bpmEngine.getProcessById('identifier guid');
// determine the function to which the entity needs to be added.
BPMFunction bpmFunction = bpmProcess.getFunctionContainingPhrase('KYC');
// add entity to the bpmFunction.
bpmFunction.addEntity(newEntity).withLinkType(LinkType.COLOR.RED)
// save the process or persist it back
bpmEngine.saveProcess(bpmProcess);
```

Returning to FIG. 6, for verbs and/or adverbs (610 in FIG. 6) a new process function entity (or other process model entity that is appropriate for an "action" for the process model that is stored in database 104) is created at 611. The definition of the newly created process function entity may be derived using the words/text around the verbs/adverbs at 612. This may be performed using spaCy's dependency parsing to construct a definition for the newly created process model entity.

Figure 5D:
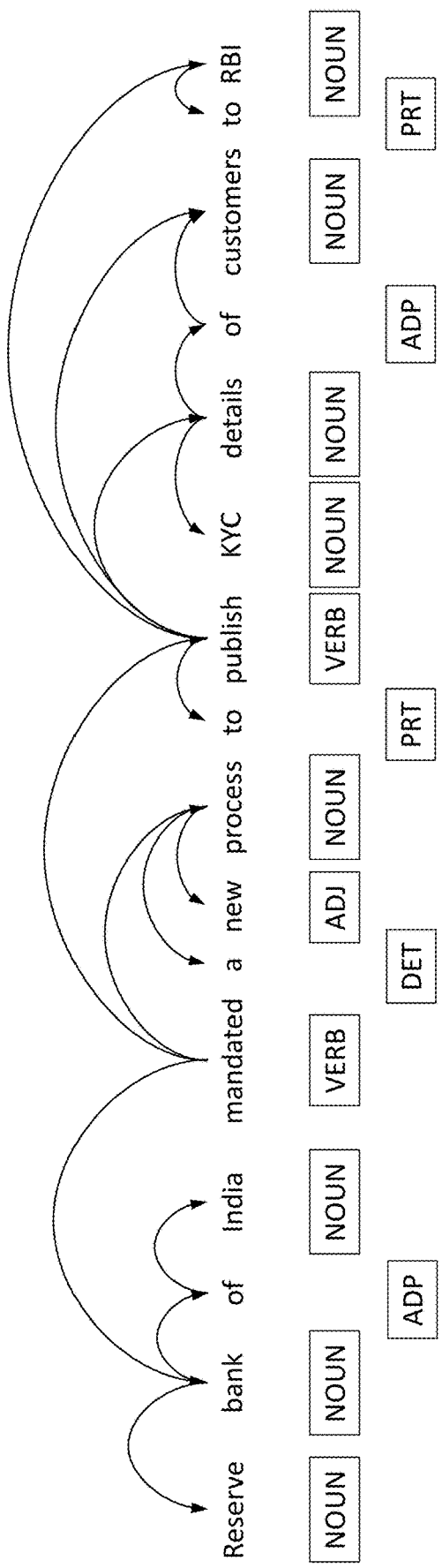

An example of such dependency parsing with a verb may be the following sentence, "Reserve bank of India mandated a new process to publish KYC details of customers to RBI during opening of new account." A portion of the results of parsing this sentence is shown in FIG. 5D. In this case, the categorized word is "publish", which is identified as a VERB (thus resulting in performing the process that is associated with step 610).

At 614, a definition for the newly created process entity may be generated based on the words that are based on, depend, or surround the VERB/ADVERB. An example code snippet of this is provided below:

TABLE 17

```
import spacy
nlp = spacy.load("en_core_web_sm")
doc = nlp(u" Reserve bank of India mandated a new process to publish
KYC details of customers to RBI during opening of new account ")
for token in doc:
    print(token.text, token.dep_, token.head.text, token.head.pos_,
        [child for child in token.children])
```

Referring again to the example in FIG. 5D, dependent words around "publish" include "KYC details of customers" and "to RBI." Each of the words may be added to data structure that is associated with the verb. An example data structure may be {<VERB>, <Subject1>, . . . <SubjectN>}. The subjects that depend on the verb may be added to the data structure based on how close they are to the verb. Thus, "KYC details of customers" may be added first, then "to RBI."

From the generated data structure, the verb and various subjects may be concatenated together to form the description for the newly created process model entity. Thus, the description for the new process function may be "Publish KYC details of customers to RBI." The new process model entity (e.g., the process function) is then added to the process model and then linked to other entities within the process model based on a similarity score (e.g., determined from 318).

FIG. 7C shows an example where a newly created process function 742 is added to the existing process model. The derived similarity score may be used to give an indication (by reaching a certain threshold) of a similarity between the existing function 'Submit KYC document' and the new function 742 to be added whereby this new function is a proposed addition to the process model. As discussed above, when changes are made to the existing process model they may be highlighted by having the new process function 742 rendered or otherwise displayed in another color (e.g., a color to indicate that this change is proposed and has not been finalized).

It will be appreciated that in certain instances an exact definition and/or the exact nature of the links may not be able to be determined. In such cases, it may further be improved by the process owner (e.g., at 326) as the modifications are clearly marked (e.g., via highlighting or using different coloring of the changed/added process entities) to draw the attention of the process owner. Accordingly, a final confirmation may be performed by the process owner. It will also be appreciated that even in case where further adaptations are needed, that these would typically require less work that starting with no changes at all. Further, by using these techniques, erroneous typos or false references may be eliminated due to the automated nature by which the process entity is defined (and linked).

Figure 9A:
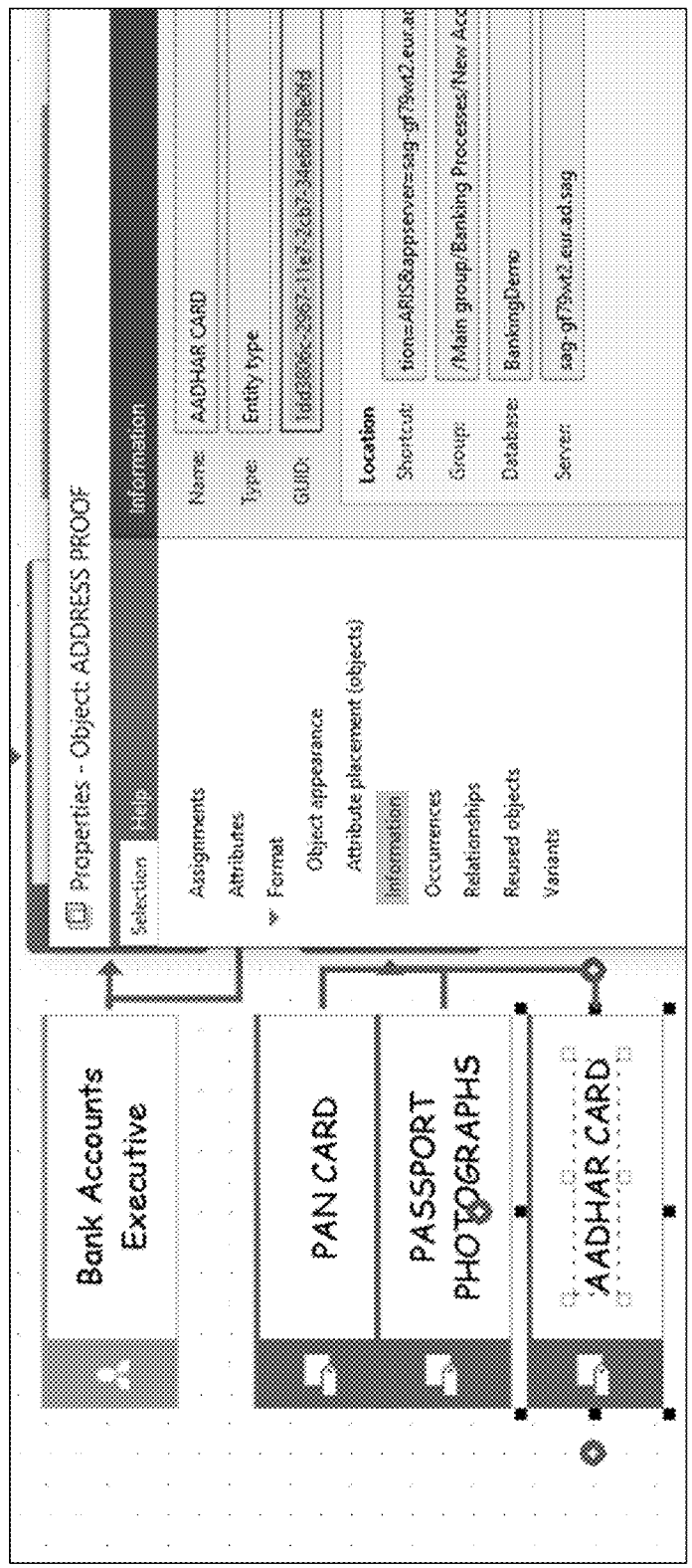
FIGS. 9A-9B are screenshots of a graphical user interface that shows an example process model that is being modified according to the process shown in FIG. 8.
Figure 9B:
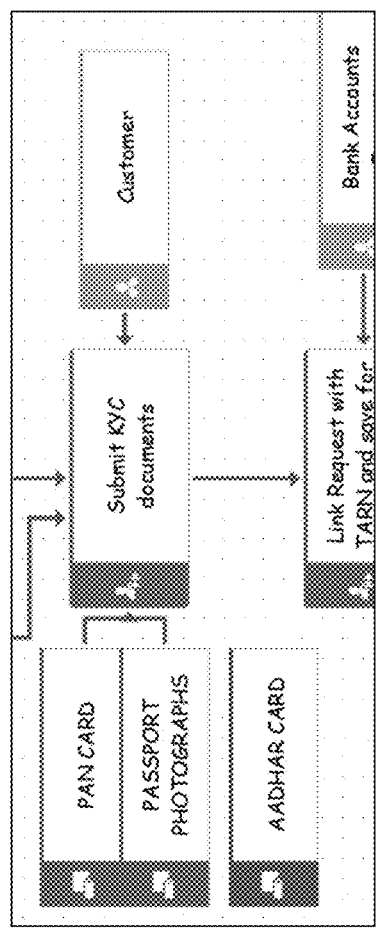

Description of FIG. 8-9B

FIG. 8 shows a process that occurs when the text from the external source is categorized to the removal category. As with the process shown in FIG. 6, the process in FIG. 8 may be performed by the process engine interfacing module 214.

At 802, the text that has been categorized into the removal category is used as a basis to search (e.g., via API calls using the process engine 106 and/or database queries) the process model entities that are stored in database 104. In certain example embodiments, this searching may include using regex patterns and matchers. For example, if the word in the external text that is classified to the removal category is "optional," then other synonyms for optional may also be searched within the process model. Such searches may be performed against, for example, the description or definition field of every process model entity within the database.

When a potential match is identified, then the id(s) of those one or more process model entities is retrieved at 804. As noted above this may be a GUID or other identifier that uniquely identifies each process model entity within an overall process model. In certain examples, the ID may be for the process model itself (e.g., if there are multiple process models). The entity within the process model may then be located via the textual string.

At 806, the links to/from the process model entities for those IDs are deleted (or marked for deletion). This may be accomplished via API calls to the process engine 106 by using the process entity identifier. An example code snippet of the above described process is provided below:

TABLE 18

```
// get instance of BPMEngine
BPMEngine bpmEngine = BPMEngine.getInstance( );
//retrieve the process model being dealt with
BPMProcess bpmProcess = bpmEngine.getProcessById('identifier guid ");
// retrieve entity
Entity entityTobeDeleted = bpmProcess.searchEntityWithContent('aadhar card');
// delete link of entity from the process model
bpmEngine.getProcessById("id").deletelink(entityTobeDeleted.getlink( ))
//mark the deleted entity with red color
entityToBeDeleted.setColor(Color.RED);
// save the process model, after making above changes.
bpmEngine.saveProcess('identifier guid');
```

As shown in the above example, the 'Aadhar card' is an entity which gets detached from a function. The version of this process may then be saved and subsequently presented to a process owner who is notified with this change. This thus allows the process to be in-line with external data (e.g., in real time).

FIGS. 9A and 9B graphically show the above described process in the context of a use case that involves a banking process. FIG. 9A shows the process model before modification and FIG. 9B shows the process model after modification.

In the example shown in FIGS. 9A and 9B relates to a new regulation that the Aadhaar card is no longer a mandatory identification requirement (e.g., text from a news article automatically identifies that is associated with the removal category and is associated with the word "Aadhar").

The word "Aadhar" is used to search the process model entities of the modeled process and results in locating the "AADHAR CARD" process model entity. The id of that process model entity ("1dd3806c-2967-11e7-2cb7-34e6d758e0fd") is fetched. This id is then used to delete the links that are associated with that entity—thus resulting in modification of the process model as is graphically shown in FIG. 9B. As with the other modifications discussed herein, this modification is also illustrated by using highlighting, different colors, etc.

Figure 10:
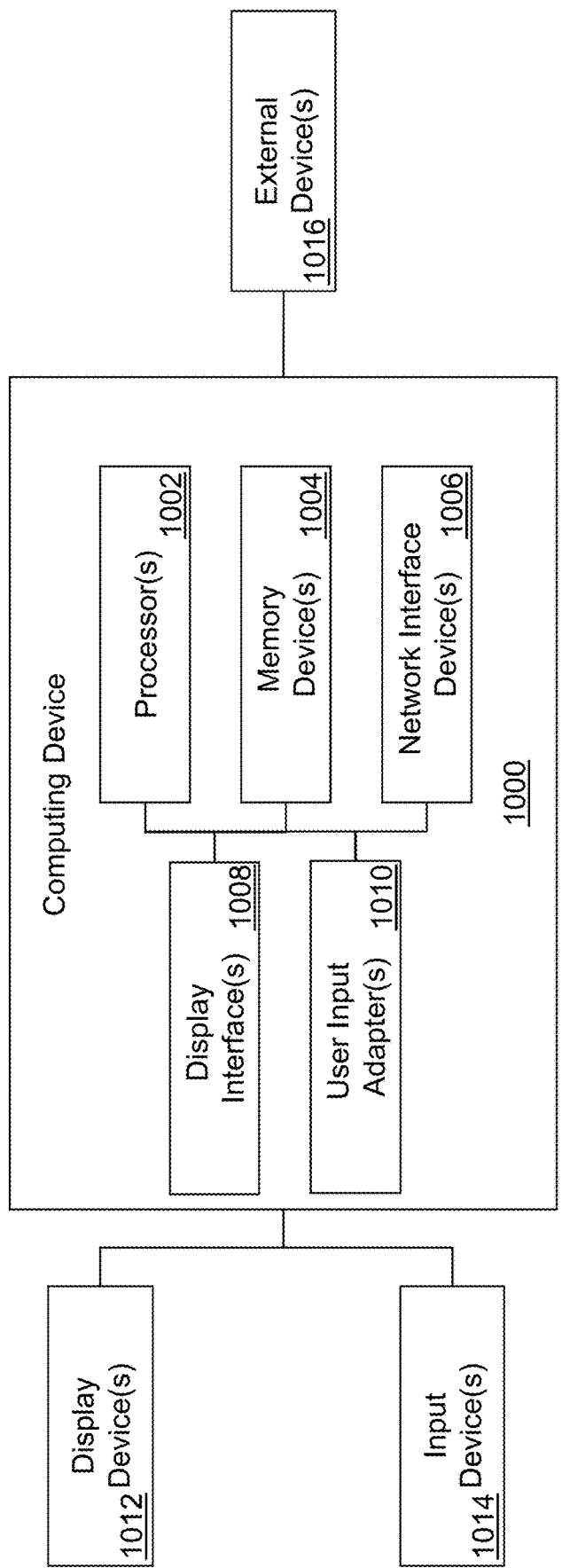
FIG. 10 shows an example computing device that may be used in some embodiments to implement features described herein.

Description of FIG. 10

FIG. 10 is a block diagram of an example computing device 1000 (which may also be referred to, for example, as a "computing device," "computer system," or "computing system") according to some embodiments. In some embodiments, the computing device 1000 includes one or more of the following: one or more processors 1002; one or more memory devices 1004; one or more network interface devices 1006; one or more display interfaces 1008; and one or more user input adapters 1010. Additionally, in some embodiments, the computing device 1000 is connected to or includes one or more display devices 1012. Additionally, in some embodiments, the computing device 1000 is connected to or includes one or more input devices 1014. In some embodiments, computing device 1000 may be connected to one or more external devices 1016. As will explained below, these elements (e.g., the processors 1002, memory devices 1004, network interface devices 1006, display interfaces 1008, user input adapters 1010, display devices 1012, input devices 1014, external devices 1016) are hardware devices (for example, electronic circuits or combinations of circuits) that are configured to perform various different functions for and/or in conjunction with the computing device 1000.

In some embodiments, each or any of the processors 1002 is or includes, for example, a single- or multi-core processor, a microprocessor (e.g., which may be referred to as a central processing unit or CPU), a digital signal processor (DSP), a microprocessor in association with a DSP core, an Application Specific Integrated Circuit (ASIC), a Field Programmable Gate Array (FPGA) circuit, or a system-on-a-chip (SOC) (e.g., an integrated circuit that includes, for example, a CPU, a GPU, and other hardware components such as memory and/or a memory controller (e.g., Northbridge), I/O controller (e.g., Southbridge), networking interfaces, and the like). In some embodiments, each or any of the processors 1002 uses an instruction set architecture such as x86 or Advanced RISC Machine (ARM). In some embodiments, each or any of the processors 1002 is or includes, for example, a graphical processing unit (GPU), which may be an electronic circuit designed to generate images and the like.

In some embodiments, each or any of the memory devices 1004 is or includes a random access memory (RAM) (such as a Dynamic RAM (DRAM) or Static RAM (SRAM)), a flash memory (based on, e.g., NAND or NOR technology), a hard disk, a magneto-optical medium, an optical medium, cache memory, a register (e.g., that holds instructions that may be executed by one or more of the processors 1002), or other type of device that performs the volatile or non-volatile storage of data and/or instructions (e.g., software that is executed on or by processors 1002). Memory devices 1004 are an example of non-transitory computer-readable storage.

In some embodiments, each or any of the network interface devices 1006 includes one or more circuits (such as a baseband processor and/or a wired or wireless transceiver), and implements layer one, layer two, and/or higher layers for one or more wired communications technologies (such as Ethernet (IEEE 802.3)) and/or wireless communications technologies (such as Bluetooth, WiFi (e.g., IEEE 802.11), GSM, CDMA2000, UMTS, LTE, LTE-Advanced (LTE-A), and/or other short-range (e.g., Bluetooth Low Energy, RFID), mid-range, and/or long-range wireless communications technologies). Transceivers may comprise circuitry for a transmitter and a receiver. The transmitter and receiver may share a common housing and may share some or all of the circuitry in the housing to perform transmission and reception. In some embodiments, the transmitter and receiver of a transceiver may not share any common circuitry and/or may be in the same or separate housings.

In some embodiments, each or any of the display interfaces 1008 is or includes one or more circuits that receive data from the processors 1002 (e.g., via a discrete GPU, an integrated GPU, a CPU executing graphical processing, or the like) that are used to generate corresponding image data based on the received data, and/or output (e.g., a High-Definition Multimedia Interface (HDMI), a DisplayPort Interface, a Video Graphics Array (VGA) interface, a Digital Video Interface (DVI), or the like) the generated image data to the display device 1012, which displays the image data thereon. Alternatively or additionally, in some embodiments, each or any of the display interfaces 1008 is or includes, for example, a video card, video adapter, or graphics processing unit (GPU). In other words, the each or any of the display interfaces 1008 may include a processor therein that is used to generate image data. The generation or such images may occur in conjunction with processing performed by one or more of the processors 1002.

In some embodiments, each or any of the user input adapters 1010 is or includes one or more circuits that receive and process user input data from one or more user input devices (1014) that are included in, attached to, or otherwise in communication with the computing device 1000, and that output data based on the received input data to the processors 1002. Alternatively or additionally, in some embodiments each or any of the user input adapters 1010 is or includes, for example, a PS/2 interface, a USB interface, a touchscreen controller, or the like; and/or the user input adapters 1010 facilitates input from user input devices 1014.

In some embodiments, the display device 1012 may be a Liquid Crystal Display (LCD) display, Light Emitting Diode (LED) display, or other type of display device. In embodiments where the display device 1012 is a component of the computing device 1000 (e.g., the computing device and the display device are included in a unified housing), the display device 1012 may be a touchscreen display or non-touch-screen display. In embodiments where the display device 1012 is connected to the computing device 1000 (e.g., is external to the computing device 1000 and communicates with the computing device 1000 via a wire and/or via wireless communication technology), the display device 1012 is, for example, an external monitor, projector, television, display screen, etc . . . .

In some embodiments, each or any of the input devices 1014 is or includes machinery and/or electronics that generates a signal that is provided to the user input adapter(s) 1010 in response to physical phenomenon. Examples of inputs devices 1014 include, for example, a keyboard, a mouse, a trackpad, a touchscreen, a button, a joystick, a sensor (e.g., an acceleration sensor, a gyro sensor, a temperature sensor, and the like). In some examples, one or more input devices 1014 generate signals that are provided in response to a user providing an input—for example, by pressing a button or actuating a joystick. In other examples, one or more input devices generate signals based on sensed physical quantities (e.g., such as force, temperature, etc . . . ). In some embodiments, each or any of the input devices 1014 is a component of the computing device (for example, a button is provide on a housing that includes the processors 1002, memory devices 1004, network interface devices 1006, display interfaces 1008, user input adapters 1010, and the like).

In some embodiments, each or any of the external device(s) 1016 includes further computing devices (e.g., other instances of computing device 1000) that communicate with computing device 1000. Examples may include a server computer, a client computer system, a mobile computing device, a cloud-based computer system, a computing node, an Internet of Things (IoT) device, etc . . . that all may communicate with computing device 1000. In general, external devices(s) 1016 may include devices that communicate (e.g., electronically) with computing device 1000. As an example, computing device 1000 may be a game device that communicates over the Internet with a server computer system that is an example of external device 1016. Conversely, computing device 1000 may be a server computer system that communicates with a game device that is an example external device 1016.

In various embodiments, the computing device 1000 includes one, or two, or three, four, or more of each or any of the above-mentioned elements (e.g., the processor(s) 1002, memory device(s) 1004, network interface device(s) 1006, display interface(s) 1008, user input adapter(s) 1010, display device(s) 1012, input device(s) 1014). Alternatively or additionally, in some embodiments, the computing device 1000 includes one or more of: a processing system that includes the processors 1002; a memory or storage system that includes the memory devices 1004; and a network interface system that includes the network interface devices 1006.

The computing device 1000 may be arranged, in various embodiments, in many different ways. As just one example, the computing device 1000 may be arranged such that the processors 1002 include: a multi (or single)-core processor; a first network interface device (which implements, for example, WiFi, Bluetooth, NFC, etc . . . ); a second network interface device that implements one or more cellular communication technologies (e.g., 3G, 4G LTE, CDMA, etc . . . ); memory or storage devices (e.g., RAM, flash memory, or a hard disk). The processor, the first network interface device, the second network interface device, and the memory devices may be integrated as part of the same SOC (e.g., one integrated circuit chip). As another example, the computing device 1000 may be arranged such that: the processors 1002 include two, three, four, five, or more multi-core processors; the network interface devices 1006 include a first network interface device that implements Ethernet and a second network interface device that implements WiFi and/or Bluetooth; and the memory devices 1004 include a RAM and a flash memory or hard disk. As another example, the computing device 1000 may include a SoC with one or processors 1002, plural network interface devices 1006, memory devices 1004 that include system memory and memory for application programs and other software, a display interface 1006 that is configured to output a video signal, a display device 1012 that is integrated to a housing with the mentioned and layered with a touch screen input device 1014, and multiple input device 1014 such as one or more joysticks, one or more buttons, and one or more sensors.

As previously noted, whenever it is described in this document that a software module or software process performs any action, the action is in actuality performed by underlying hardware elements according to the instructions that comprise the software module. Consistent with the foregoing, in various embodiments, each or any combination of the computer system 100, the process model recommendation engine 102, the process engine 106, Categorization Module 202, the grouping module 208, the semantic similarity module 210, the Process Improvement Determination Module 212, the Process Engine Interfacing Module 214, each of which will be referred to individually for clarity as a "component" for the remainder of this paragraph, are implemented using an example of the computing device 1000 of FIG. 10. In such embodiments, the following applies for each component: (a) the elements of the 1000 computing device 1000 shown in FIG. 10 (i.e., the one or more processors 1002, one or more memory devices 1004, one or more network interface devices 1006, one or more display interfaces 1008, and one or more user input adapters 1010), or appropriate combinations or subsets of the foregoing, with or without the one or more display devices 1012, one or more input devices 1014, and/or external devices 1016) are configured to, adapted to, and/or programmed to implement each or any combination of the actions, activities, or features described herein as performed by the component and/or by any software modules described herein as included within the component; (b) alternatively or additionally, to the extent it is described herein that one or more software modules exist within the component, in some embodiments, such software modules (as well as any data described herein as handled and/or used by the software modules) are stored in the memory devices 1004 (e.g., in various embodiments, in a volatile memory device such as a RAM or an instruction register and/or in a non-volatile memory device such as a flash memory or hard disk) and all actions described herein as performed by the software modules are performed by the processors 1002 in conjunction with, as appropriate, the other elements in and/or connected to the computing device 1000 (e.g., the network interface devices 1006, display interfaces 1008, user input adapters 1010, display device(s) 1012, input device(s) 1014, and/or external device(s) 1016); (c) alternatively or additionally, to the extent it is described herein that the component processes and/or otherwise handles data, in some embodiments, such data is stored in the memory devices 1004 (e.g., in some embodiments, in a volatile memory device such as a RAM and/or in a non-volatile memory device such as a flash memory or hard disk) and/or is processed/handled by the processors 1002 in conjunction, as appropriate, the other elements in and/or connected to the computing device 1000 (e.g., the network interface devices 1006, display interfaces 1008, user input adapters 1010, display device 1012, input device(s) 1014, and/or external device(s) 1016); (d) alternatively or additionally, in some embodiments, the memory devices 1002 store instructions that, when executed by the processors 1002, cause the processors 1002 to perform, in conjunction with, as appropriate, the other elements in and/or connected to the computing device 1000 (e.g., the memory devices 1004, network interface devices 1006, display interfaces 1008, user input adapters 1010, display device(s) 1012, input device(s) 1014, and/or external device(s) 1016), each or any combination of actions described herein as performed by the component and/or by any software modules described herein as included within the component.

The hardware configurations shown in FIG. 10 and described above are provided as examples, and the subject matter described herein may be utilized in conjunction with a variety of different hardware architectures and elements. For example: in many of the Figures in this document, individual functional/action blocks are shown; in various embodiments, the functions of those blocks may be implemented using (a) individual hardware circuits, (b) using an application specific integrated circuit (ASIC) specifically configured to perform the described functions/actions, (c) using one or more digital signal processors (DSPs) specifically configured to perform the described functions/actions, (d) using the hardware configuration described above with reference to FIG. 10, (e) via other hardware arrangements, architectures, and configurations, and/or via combinations of the technology described in (a) through (e).

Technical Advantages of Described Subject Matter

In certain example embodiments, external data (e.g., textual data) from, for example, news sources or regulation websites is analyzed to determine how a process model should be automatically updated. This avoids having to have users manually inspect process execution logs as the externally sourced data is relied upon for updates. This also allows the process model to kept in-line with externally sourced data that reflects real world events. Thus the process model may be kept up to date in real time as real world events occur. Such automatic processing advantageously avoids having to rely on users to recognize and start the process for updating a process model.

Natural language processing is used for the externally sourced data to identify if an improvement to the process model may be made. This is accomplished by determining whether a word or words within the text is associated with one of multiple possible categories and then further analyzing the structure of the text to determine dependent words. These dependent words are then used to determine how the process model should be automatically updated.

In certain examples, the automatic updates may be advantageously shown in a different color or otherwise highlighted within the GUI for the process model. This allows users to see what changes have been automatically performed and provides, at worst, a starting point for modifying the process model. At best, the changes may be accepted and incorporated as is. Thus, advantageously, the system can determine changes to the process model without any manual intervention.

Selected Terminology

Whenever it is described in this document that a given item is present in "some embodiments," "various embodiments," "certain embodiments," "certain example embodiments", "some example embodiments", "an exemplary embodiment," or whenever any other similar language is used, it should be understood that the given item is present in at least one embodiment, though is not necessarily present in all embodiments. Consistent with the foregoing, whenever it is described in this document that an action "may," "can," or "could" be performed, that a feature, element, or component "may," "can," or "could" be included in or is applicable to a given context, that a given item "may," "can," or "could" possess a given attribute, or whenever any similar phrase involving the term "may," "can," or "could" is used, it should be understood that the given action, feature, element, component, attribute, etc. is present in at least one embodiment, though is not necessarily present in all embodiments. Terms and phrases used in this document, and variations thereof, unless otherwise expressly stated, should be construed as open-ended rather than limiting. As examples of the foregoing: "and/or" includes any and all combinations of one or more of the associated listed items (e.g., a and/or b means a, b, or a and b); the singular forms "a", "an" and "the" should be read as meaning "at least one," "one or more," or the like; the term "example" is used provide examples of the subject under discussion, not an exhaustive or limiting list thereof; the terms "comprise" and "include" (and other conjugations and other variations thereof) specify the presence of the associated listed items but do not preclude the presence or addition of one or more other items; and if an item is described as "optional," such description should not be understood to indicate that other items are also not optional.

As used herein, the term "non-transitory computer-readable storage medium" includes a register, a cache memory, a ROM, a semiconductor memory device (such as a D-RAM, S-RAM, or other RAM), a magnetic medium such as a flash memory, a hard disk, a magneto-optical medium, an optical medium such as a CD-ROM, a DVD, or Blu-Ray Disc, or other type of device for non-transitory electronic data storage. The term "non-transitory computer-readable storage medium" does not include a transitory, propagating electromagnetic signal.

Additional Applications of Described Subject Matter

Although process steps, algorithms or the like, including without limitation with reference to FIGS. 3, 4, 6, and 8, may be described or claimed in a particular sequential order, such processes may be configured to work in different orders. In other words, any sequence or order of steps that may be explicitly described or claimed in this document does not necessarily indicate a requirement that the steps be performed in that order; rather, the steps of processes described herein may be performed in any order possible. Further, some steps may be performed simultaneously (or in parallel) despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary, and does not imply that the illustrated process is preferred.

Although various embodiments have been shown and described in detail, the claims are not limited to any particular embodiment or example. None of the above description should be read as implying that any particular element, step, range, or function is essential. All structural and functional equivalents to the elements of the above-described embodiments that are known to those of ordinary skill in the art are expressly incorporated herein by reference and are intended to be encompassed. Moreover, it is not necessary for a device or method to address each and every problem sought to be solved by the present invention, for it to be encompassed by the invention. No embodiment, feature, element, component, or step in this document is intended to be dedicated to the public.

The invention claimed is:

1. A computer system for updating an existing computer process model based on externally sourced data, the computer system comprising:
    a non-transitory storage medium configured to store a process model that includes a plurality of process model entities that each include textual descriptions;
    a transceiver configured to receive a plurality of electronic data messages from at least one external data source, each of the plurality of electronic data messages including text data; and
    a processing system that includes at least one hardware processor, the processing system configured to:
        generate at least one semantic similarity value that is between 1) the first text data of at least a first message of the plurality of electronic data messages, and 2) the textual description of a first process model entity of the plurality of process model entities,
        classify the first text data, based on at least a first word that is within the first text data, into one of multiple possible classifications,
        parse the first text data to determine one or more linked words that are grammatically linked to the first word,
        retrieve, from the process model, a process model entity that includes textual description that is associated with the one or more linked words,
        automatically update the process model based on the retrieved process model entity, and
        perform a grammar determination whether the one or more linked words is associated one of a first group and a second group, the first group for nouns and pronouns and the second group for verbs and adverbs,
    wherein the update to the process model is based on the performed grammar determination.

2. The computer system of claim 1, wherein the processing system is further configured to:
    generate a new process model entity and include a textual description of the new process model entity that is based on the one or more linked words,
    wherein the update to the process model uses the generated new process model entity that is added to the process model as part of the update to the process model.

3. The computer system of claim 2, wherein the processing system is further configured to:
    based on determination that the one or more linked words is part of the second group, determine one or more further words in the first text data that are linked to the one or more linked words, wherein the textual description is based on a combination of the one or more further words and the one or more linked words.

4. The computer system of claim 2, wherein the update to the process model includes adding at least one process model link between the new process model entity and the first process model entity.

5. The computer system of claim 1, wherein the multiple possible classifications includes a removal classification and an addition classification.

6. The computer system of claim 1, wherein the processing system is further configured to store one of a plurality of topic categories in connection with the text data of each one of the plurality of data electronic data messages.

7. The computer system of claim 1, wherein the processing system is further configured to store one of a plurality of topic categories in connection with the textual descriptions of each one of the plurality of process model entities.

8. The computer system of claim 1, wherein the processing system is further configured to:
    generate a plurality of pairs, where each pair is based on the topical classification of text data from an electronic data message being the same as the topical classification of the textual descriptions of a processing entity.

9. The computer system of claim 1, wherein the updates to the process model are highlighted by using a different color or other visual indicator that the update to the process model has been produced automatically.

10. A computer system for updating an existing computer process model based on externally sourced data, the computer system comprising:
    a non-transitory storage medium configured to store a process model that includes a plurality of process model entities that each include textual descriptions;
    a transceiver configured to receive a plurality of electronic data messages from at least one external data source, each of the plurality of electronic data messages including text data; and
    a processing system that includes at least one hardware processor, the processing system configured to:
        generate at least one semantic similarity value that is between 1) the first text data of at least a first message of the plurality of electronic data messages, and 2) the textual description of a first process model entity of the plurality of process model entities,
        classify the first text data, based on at least a first word that is within the first text data, into one of multiple possible classifications, wherein the multiple possible classifications includes a removal classification and an addition classification,
        parse the first text data to determine one or more linked words that are grammatically linked to the first word,
        retrieve, from the process model, a process model entity that includes textual description that is associated with the one or more linked words, automatically update the process model based on the retrieved process model entity, and based on classification of the first text data into the removal classification, determine one or more links from the process model entity that is retrieved and delete the one or more links from the process model.

11. A non-transitory computer readable storage medium comprising an application program for use with a computer system that updates an existing computer process model based on externally sourced data, the application program comprising instructions that cause the computer system to:

receive a plurality of electronic data messages from at least one external data source, each of the plurality of electronic data messages including text data;

access a process model that is stored in electronic memory, the process model including that includes a plurality of process model entities that each include textual descriptions;

retrieve at least one semantic similarity value that is between 1) the first text data of at least a first message of the plurality of electronic data messages, and 2) the textual description of a first process model entity of the plurality of process model entities;

cause the first text data to be classified, based on at least a first word that is within the first text data, into one of multiple possible classifications;

determine one or more linked words that are grammatically linked to the first word based on parsed first text data;

retrieve, from the process model, a process model entity that includes textual description that is associated with the one or more linked words;

automatically update the process model based on the retrieved process model entity; and perform a grammar determination whether the one or more linked words is associated one of a first group and a second group, the first group for nouns and pronouns and the second group for verbs and adverbs, wherein the update to the process model is based on the performed grammar determination.

12. The non-transitory computer readable storage medium of claim 11, wherein the application program comprises further instructions that cause the computer system to:

generate a new process model entity and include a textual description of the new process model entity that is based on the one or more linked words, wherein the update to the process model uses the generated new process model entity that is added to the process model as part of the update to the process model.

13. The non-transitory computer readable storage medium of claim 12, wherein the application program comprises further instructions that cause the computer system to:

based on determination that the one or more linked words is part of the second group, determine one or more further words in the first text data that are linked to the one or more linked words, wherein the textual description is based on a combination of the one or more further words and the one or more linked words.

14. The non-transitory computer readable storage medium of claim 12, wherein the update to the process model includes adding at least one process model link between the new process model entity and the first process model entity.

15. The non-transitory computer readable storage medium of claim 11, wherein the multiple possible classifications includes a removal classification and an addition classification, wherein the application program comprises further instructions that cause the computer system to:

based on classification of the first text data into the removal classification, determine one or more links from the process model entity that is retrieved and deleting the one or more links from the process model.

16. The non-transitory computer readable storage medium of claim 11, wherein the application program comprises further instructions that cause the computer system to:

wherein the updates to the process model are highlighted by using a different color or other visual indicator that the update to the process model has been produced automatically.

17. A method implemented on a computer system for updating an existing computer process model based on externally sourced data, the method comprising:

storing a process model, to non-transitory computer readable storage, that includes a plurality of process model entities that each include textual descriptions;

receiving a plurality of electronic data messages from at least one external data source, each of the plurality of electronic data messages including text data;

retrieving at least one semantic similarity value that is between 1) the first text data of at least a first message of the plurality of electronic data messages, and 2) the textual description of a first process model entity of the plurality of process model entities;

classify the first text data, based on at least a first word that is within the first text data, into one of multiple possible classifications;

determining one or more linked words that are grammatically linked to the first word;

retrieving, from the process model, a process model entity that includes textual description that is associated with the one or more linked words;

automatically updating the process model based on the retrieved process model entity; and performing a grammar determination whether the one or more linked words is associated one of a first group and a second group, the first group for nouns and pronouns and the second group for verbs and adverbs, wherein the update to the process model is based on the performed grammar determination.

* * * * *